United States Patent
Tsai et al.

(10) Patent No.: US 12,046,646 B2
(45) Date of Patent: Jul. 23, 2024

(54) CONTACT AND VIA STRUCTURES

(71) Applicant: Taiwan Semiconductor Manufacturing Company, Ltd., Hsin-Chu (TW)

(72) Inventors: Kuo-Chiang Tsai, Hsinchu (TW); Jyh-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 303 days.

(21) Appl. No.: 17/460,653

(22) Filed: Aug. 30, 2021

(65) Prior Publication Data

US 2023/0063163 A1 Mar. 2, 2023

(51) Int. Cl.
*H01L 29/417* (2006.01)
*H01L 21/311* (2006.01)
*H01L 21/3213* (2006.01)
*H01L 21/768* (2006.01)
*H01L 23/522* (2006.01)
*H01L 29/40* (2006.01)

(52) U.S. Cl.
CPC .. *H01L 29/41791* (2013.01); *H01L 21/31144* (2013.01); *H01L 21/32139* (2013.01); *H01L 21/76805* (2013.01); *H01L 21/76877* (2013.01); *H01L 23/5226* (2013.01); *H01L 29/401* (2013.01)

(58) Field of Classification Search
CPC ............. H01L 29/41791; H01L 29/401; H01L 29/0847; H01L 29/41725; H01L 21/31144; H01L 21/32139; H01L 21/76805; H01L 21/76877; H01L 21/823431; H01L 21/76804; H01L 23/5226; H01L 23/485; H01L 27/0886
See application file for complete search history.

(56) References Cited

U.S. PATENT DOCUMENTS

| | | | |
|---|---|---|---|
| 10,269,711 B1 * | 4/2019 | Liu | H01L 23/5283 |
| 10,374,040 B1 * | 8/2019 | Chanemougame | H01L 21/823431 |
| 2016/0351570 A1 * | 12/2016 | Park | H01L 21/3065 |
| 2020/0044071 A1 * | 2/2020 | Huang | G06F 30/398 |

* cited by examiner

*Primary Examiner* — Shahed Ahmed
*Assistant Examiner* — Vicki B. Booker
(74) *Attorney, Agent, or Firm* — HAYNES AND BOONE, LLP

(57) ABSTRACT

An exemplary semiconductor device includes a substrate, a first conductive feature, a second conductive feature, and a third conductive feature over the substrate. The first conductive feature has a first top surface and a side surface. The third conductive feature is on the first top surface of the first conductive feature and is spaced away from the second conductive feature. The third conductive feature has a first sidewall and a second sidewall opposing the first sidewall. The first sidewall extends between the first conductive feature and the second conductive feature. At least a segment of the first sidewall has a first slope. The second sidewall has a second slope. The second slope is greater than the first slope.

20 Claims, 21 Drawing Sheets

CONTACT AND VIA STRUCTURES

BACKGROUND

The integrated circuit (IC) industry has experienced exponential growth. Technological advances in IC materials and designs have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as the feature sizes reduce, the contact surface area between two connected conductors continues to shrink, which results in high contact resistances. Such high contact resistances may negate any improvement in performance due to the reduced node size. Accordingly, although existing interconnect technologies are generally adequate for their intended purposes, they are not satisfactory in every aspect.

BRIEF DESCRIPTION OF THE DRAWINGS

Aspects of the present disclosure are best understood from the following detailed description when read with the accompanying slides. It is emphasized that, in accordance with the standard practice in the industry, various features are not drawn to scale. In fact, the dimensions of the various features may be arbitrarily increased or reduced for clarity of discussion.

FIGS. 9 and 18 are flowcharts of embodiments of methods for fabricating an IC device according to various aspects of the present disclosure.

DETAILED DESCRIPTION

Figure 1:
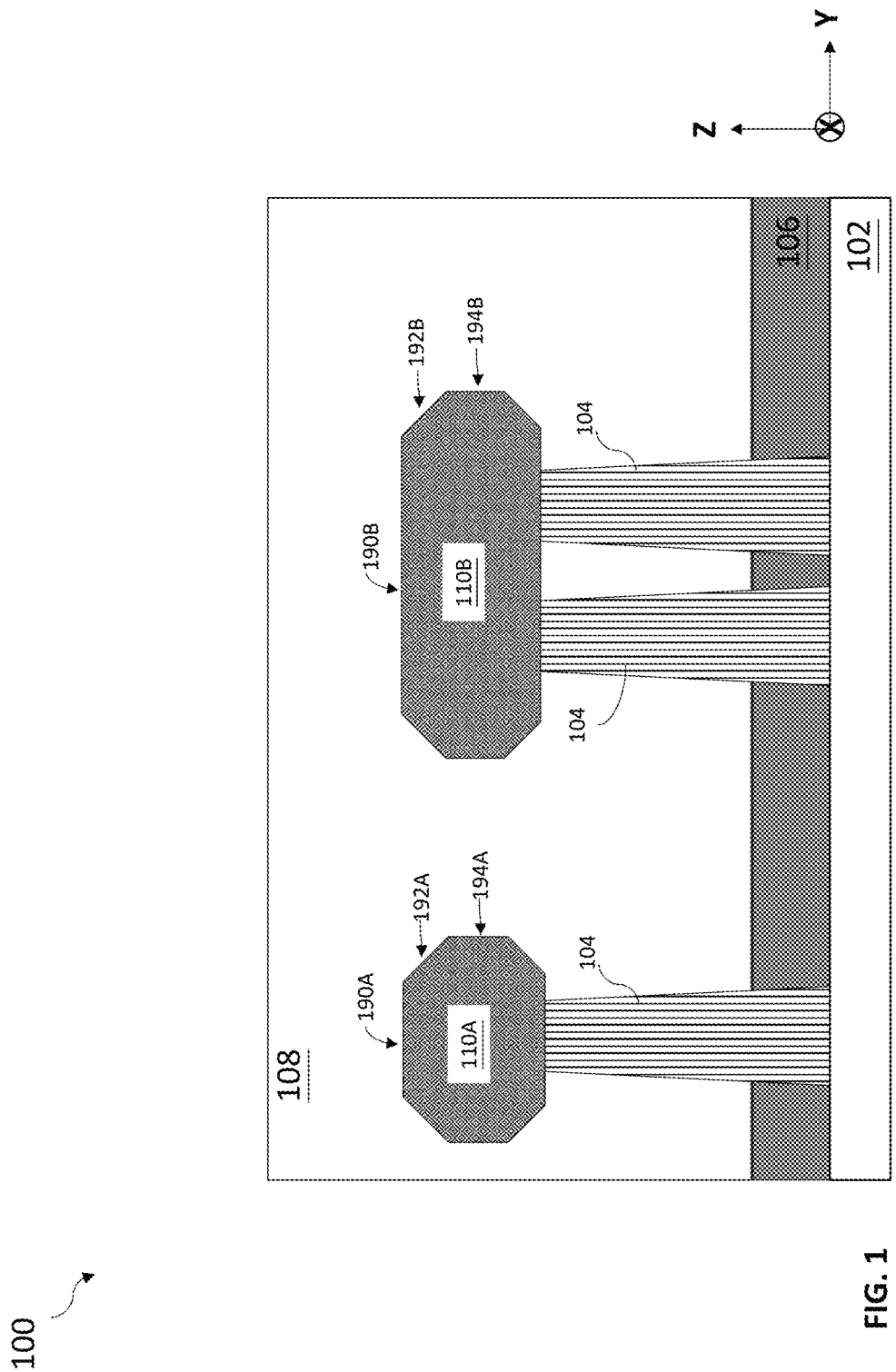
FIGS. 1, 2, 3, 4, 5, 6, 7, 8, 9, 10, 11, 12, 13, 14, 15, 16, 17, 19, 20, and 21 are cross-sectional views of an IC device at various processing stages of fabrication according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," "approximately," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices and methods of forming the same. More particularly, the present disclosure is related to semiconductor devices with reduced contact resistances (Rc). One aspect of the present disclosure involves forming source/drain contacts and via structures that have reduced contact resistances. As semiconductor fabrication progresses to ever smaller technology nodes, the overall effects of the contact resistances may begin to seriously degrade device performances, such as device speed. In that regard, contact resistance generally reduces when the contact surface area increases. Therefore, it may be beneficial to increase the size of the source/drain contact and/or the via structure so as to achieve larger contact surface areas therebetween—as long as such increase does not lead to an excessively large chip footprint that could impede the overall goal of down-scaling. However, in some approaches, such larger contacts have been shown to present significant shorting risks as the increase in size leads to reduced spac ing from adjacent source/drain features. In other words, designers may be compelled to choose between a relatively high contact resistance and a relatively high shorting risk. This disclosure recognizes that the dilemma described above may be avoided by engineering the profiles of the source/drain contacts. For example, the source/drain contacts may be engineered to have an asymmetric profile with many facets. Some of the facets may be designed to have larger surface areas and/or to interface with a conductor on multiple surfaces, so as to increase contact surface areas and reduce contact resistances with the conductor. Moreover, some of the facets may be designed to have smaller surface areas and/or to avoid certain adjacent conductors so as to reduce the shorting risks. These aspects of the disclosure are described in more details below.

FIGS. 1-8 are cross-sectional views of an IC device 100 (or device 100), along the Y-Z plane, at various processing stages of fabrication according to various aspects of the present disclosure. FIG. 9 is a flowchart of an embodiment of a method 200 for fabricating an IC device (for example, the IC device 100) according to various aspects of the present disclosure. The Y-Z plane is a plane defined by the Y-direction and the Z-direction. In that regard, X-direction and Y-direction are horizontal directions that are perpendicular to each other; and the Z-direction is a vertical direction perpendicular to both the X-direction and the Y-direction. The X-direction and the Y-direction define the X-Y plane; the Y-direction and the Z-direction define the Y-Z plane; and the X-direction and the Z-direction define the X-Z plane. As illustrated in the figures below, the IC device 100 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, the IC device 100 may apply to three-dimensional FinFET devices, as well as to planar FET devices.

Referring to FIG. 1 and block 202 of FIG. 9, an initial structure of the IC device 100 is received. The initial structure includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, or combinations thereof. As indicated above, various doped regions may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

The initial structure of the IC device 100 also includes active regions 104. In the depicted embodiments, the active regions 104 are elongated fin-like structures that protrude upwardly out of the substrate 102 (for example, along the Z-direction). As such, the active regions 104 may be interchangeably referred to as fins 104 or fin structures 104 hereinafter. The fin structures 104 are oriented lengthwise along the X-direction. The fin structures 104 may be fabricated using suitable processes including photolithography and etch processes. The photolithography process may include forming a photoresist layer overlying the substrate 102, exposing the photoresist to a pattern, performing post-exposure bake processes, and developing the photoresist to form a masking element (not shown) including the resist. The masking element is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 104.

The initial structure of the IC device 100 further includes the isolation structures 106. The isolation structures 106 electrically separate various components of the IC device 100. The isolation structures 106 may include silicon oxide, silicon nitride, silicon oxynitride, fluoride-doped silicate glass (FSG), a low-k dielectric material, and/or other suitable materials. In some embodiments, the isolation structures 106 may include shallow trench isolation (STI) features. In one embodiment, the isolation structures 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 106. Alternatively, the isolation structures 106 may include a multi-layer structure, for example, having one or more thermal oxide liner layers.

In some embodiments, the IC device 100 further includes gate structures formed over the fin structures 104. For example, the gate structures may be formed along the Y-direction and perpendicular to the lengthwise direction of the fin structures 104. In other words, the gate structures are formed in a Y-Z plane. In the depicted embodiments, the Y-Z plane of the gate structure extends in parallel with but offset from the Y—Z cross-section of FIG. 1 along the X-direction. Accordingly, FIG. 1 does not depict the gate structure. The gate structures may include gate stacks and gate spacers adjacent the gate stacks. The gate stacks may be dummy gate stacks (e.g., containing an oxide gate dielectric and a polysilicon gate electrode), or they may be high-k metal gate (HKMG) stacks that contain a high-k gate dielectric and a metal gate electrode, where the HKMG structures are formed by replacing the dummy gate structures. In some embodiments, the gate spacers include multiple layers.

The initial structure of the IC device 100 additionally includes source/drain features 110A, 110B formed in the source/drain regions. The source/drain features 110A, 110B may be formed using any suitable methods. In some embodiments, the fin structures 104 are recessed in the on both sides of the gate structures to form recessed source/drain regions on the fin structures 104. Source/drain features 110A, 110B are subsequently formed on the recessed source/drain regions. In some embodiments, the source/drain features 110A, 110B are formed using epitaxy processes. Accordingly, the source/drain features 110A, 110B are interchangeably referred to as epitaxial features 110A, 110B, and/or epitaxial source/drain features 110A, 110B. The source/drain features (such as source/drain feature 110A) may be formed over a single recessed fin structure 104. Alternatively, the source/drain features (such as source/drain feature 110B) may be formed over (or "merges over") two or more adjacent recessed fin structures 104. The present disclosure contemplates the source/drain features 110A, 110B each being formed over any number of fin structures 104. The source/drain features 110A, 110B each have multiple facets (or surfaces). In the depicted embodiments, the source/drain features 110A, 110B each have a profile that resembles an octagon. For example, the source/drain feature 110A, 110B each have a respective top surface 190A, 190B, a respective canted side surface 192A, 192B, and a respective vertical side surface 194A, 194B. However, the source/drain features 110A, 110B may each have any suitable profiles.

The initial structure of the IC device 100 also includes an interlayer dielectric (ILD) layer 108 over the isolation structures 106, such that the top portions of the fin structures 104 are embedded within the ILD layer 108. Moreover, the gate structures, the source/drain features 110A, 110B are also at least partially embedded within the ILD layer 108. For example, the ILD layer 108 may be formed on each of the top surfaces 190A, 190B, the canted side surface 192A, 192B, and the vertical side surface 194A, 194B of the source/drain features 110A, 110B. The ILD layer 108 may include any suitable materials, such as silicon carbonitride (SiCN), silicon oxycarbonitride (SiOCN), silicon oxynitride (SiON), metal oxides, other suitable materials, or combinations thereof.

Figure 2:
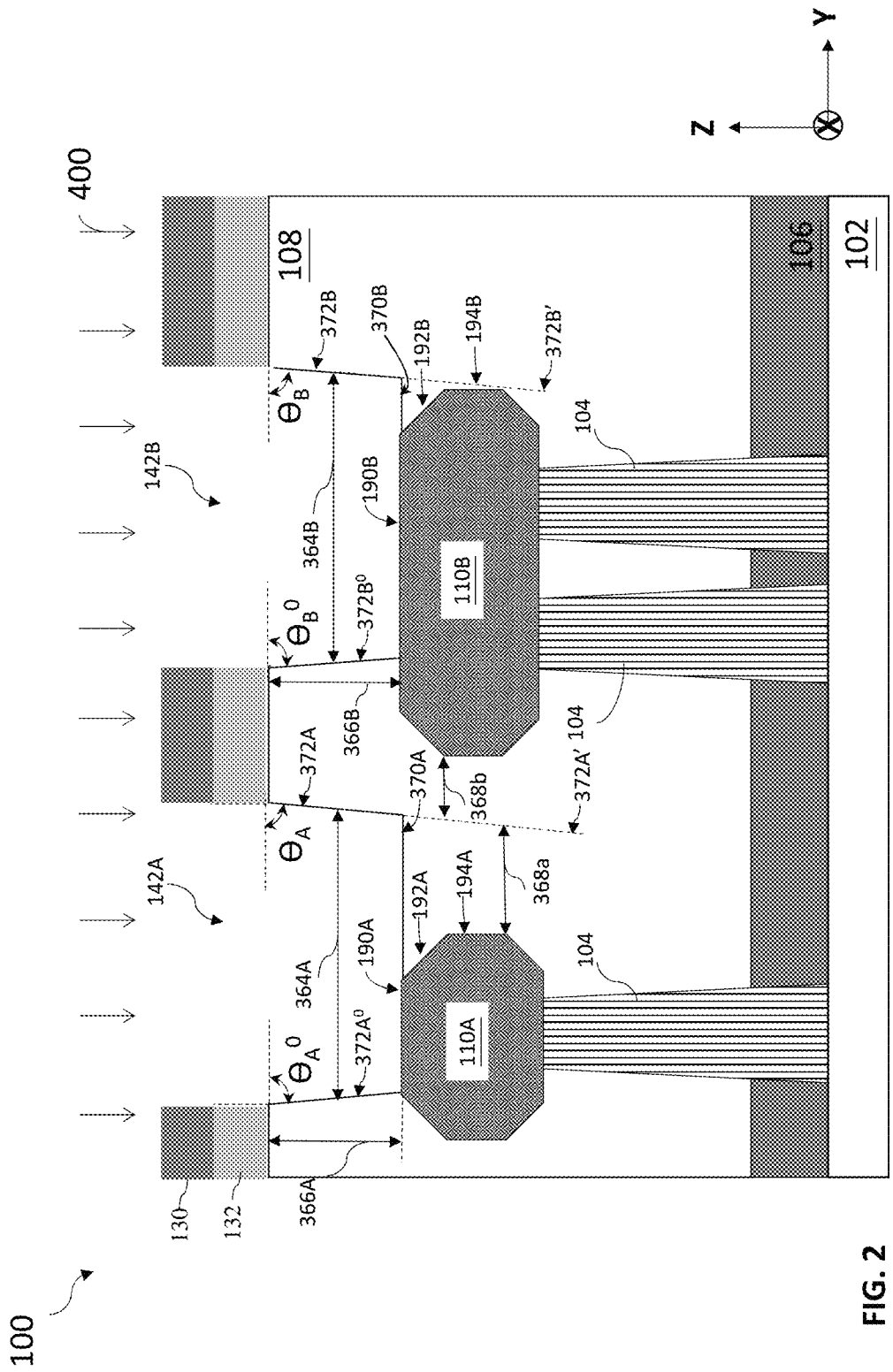

Referring to FIG. 2 and to block 204 of FIG. 9, contact trenches 142A, 142B are formed in the ILD layer 108 over top surfaces 190A, 190B of the respective source/drain features 110A, 110B. The profiles of the contact trenches 142A, 142B partially define the profiles of the contact features subsequently formed therein. In the depicted embodiments, the contact trench 142A expose the entire top surface 190A of the source/drain feature 110A; and the contact trench 142B expose a portion of the top surface 190B of the source/drain feature 110B. The present disclosure contemplates the contact trenches 142A, 142B exposing either portion of or entire top surfaces of either source/drain features 110A, 110B. Moreover, the contact trenches 142A, 142B extend beyond the top surfaces of the source/drain features 110A, 110B, along the Y-direction. For example, the contact trench 142A has a bottom surface 370A that extends beyond the top surface of the source/drain contact 190A. In this instance, a lateral dimension of the contact trench 142A along the Y-direction is greater than a corresponding dimension of the top surface 190A of the source/drain feature 110A along the Y-direction. For example, the contact trench 142B has a bottom surface 370B that extends beyond the top surface of the source/drain contact 190B. In this instance, the contact trench 142B is offset from the source/drain features 110B along the Y-direction. Accordingly, at least a portion of the ILD layer 108 is exposed on the bottom surfaces 370A, 370B of the respective contact trenches 142A, 142B. Additionally, a portion of the ILD layer 108 is also exposed on the side surfaces 372A, 372A⁰, 372B, and 372B⁰ of the contact trenches 142A, 142B.

Figure 3:
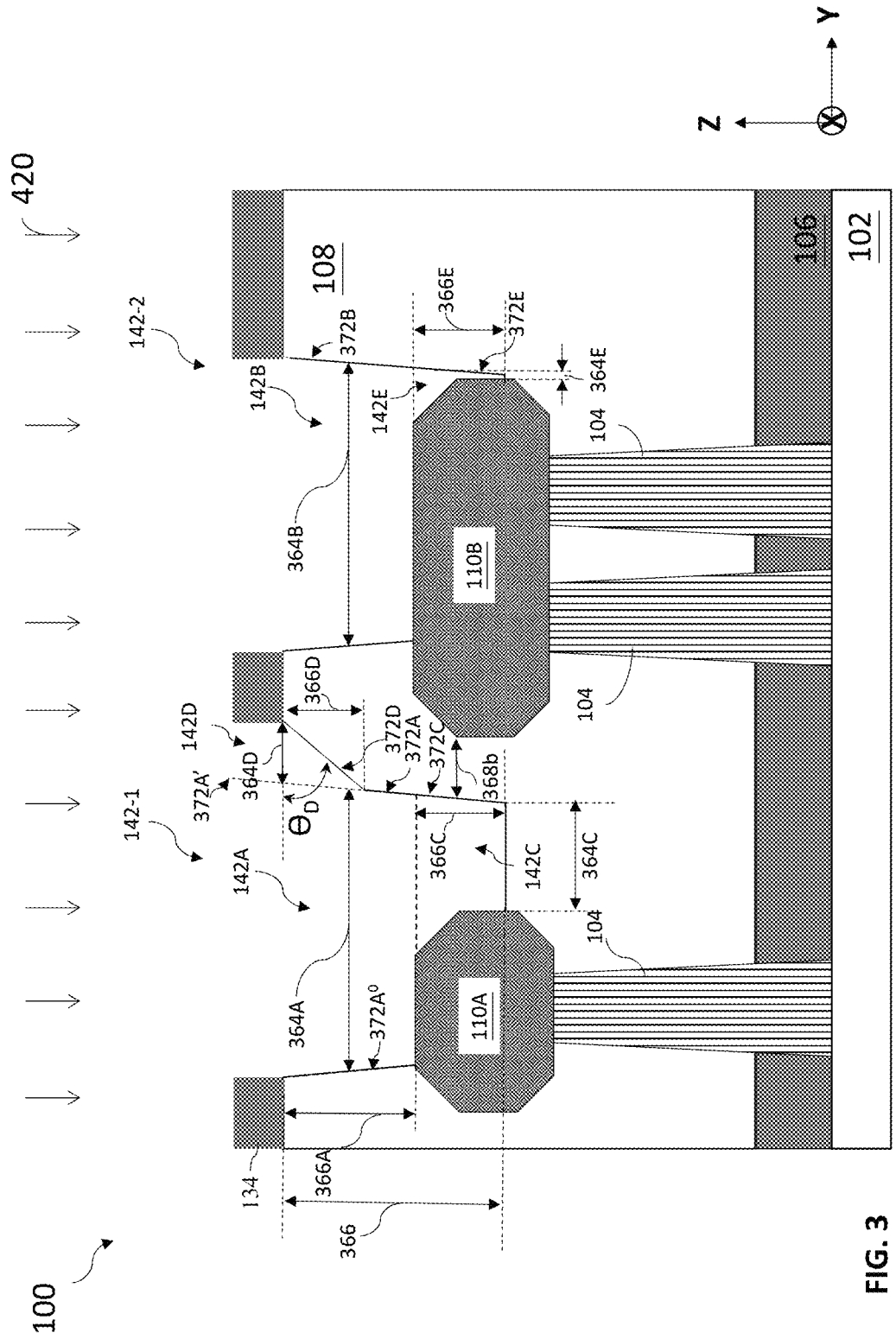

In the depicted embodiments, the contact trench 142A has a lateral dimension 364A along the Y-direction and a depth dimension 366A along the Z-direction. In some embodiments, the depth dimension 366A may be about 10 nm to about 60 nm, for example, about 20 nm to about 40 nm. If the depth dimension 366A is too large, the device may suffer increased contact resistance (the "vertical contact resistance") to the fin; conversely, if the depth dimension 366A is too small, the device may instead suffer higher lateral resistance. In some embodiments, the contact trench 142A has varying lateral widths along its height dimension. For example, the contact trench 142A may have a greater lateral width at the top surface (e.g. along the top surface of the ILD layer 108) than at the bottom surface (e.g. at the top surface of the source/drain feature 110A). In such embodiments, the lateral dimension 364A refers to the average lateral dimension of the contact trench 142A. In the depicted embodiments, the average lateral dimension 364A is about the same as the lateral dimension at the half-height level of the contact trench 142A. In some embodiments, the lateral dimension 364A may be about 10 nm to about 60 nm, for example, about 20 nm to about 30 nm. If the lateral dimension 364A is too large, such as larger than about 60 nm, the spacing from adjacent source/drain features may be too small to avoid shorting; conversely, if the lateral dimension 364A is too small, such as less than about 10 nm, there may be insufficient amount of charge carrier available to form the current, thereby adversely affecting the current. The lateral dimension 364A and the slope of the side surfaces 372A, 372A⁰ partially define the profile of the subsequently formed contact feature in the contact trench 142A. Moreover, as illustrated in FIG. 3, the side surface 372A of the contact trench 142A extends along an imaginary extension surface 372A'. In some embodiments, the contact trench 142A is subsequently deepened (further etched) along the imaginary extension surface 372A'. In some embodiments, the side surface 372A and consequently the imaginary extension surface 372A' may be canted from the Z-direction. For example, the side surface 372A and the imaginary extension surface 372A' may span an angle $\theta_A$ from the Y-direction. The angle $\theta_A$ is indicative of the slope of the respective side surface 372A and the imaginary extension surface 372A'. In some embodiments, the imaginary extension surface 372A' extends downwards passing the entire vertical side surface 194A without interfacing with the canted side surface 192A or the vertical side surface 194A. Accordingly, the contact later formed in the subsequently deepened contact trench 142A interfaces with source/drain feature 110A on the entirety of the vertical side surface 194A, as well as on the entire canted surface 192A, such that the contact surface area therebetween is increased and the contact resistance is reduced. A minimal distance along the Y-direction between the imaginary extension surface 372A' and the source/drain feature 110B along the Y-direction is distance 368b. In some embodiments, the distance 368b is about 1 nm to about 20 nm. As described later, the contact trenches 142A, 142B are subsequently deepened. If the distance 368b is too small, such as less than 1 nm, the subsequently formed contact feature in the deepened contact trench may be too close to the source/drain feature 110B to cause shorting concerns. If the distance 368b is too large, such as greater than about 20 nm, the contact may not have adopted its maximal size. Accordingly, the contact resistance therebetween may not have been minimized. In some embodiments, the sum of the distance 368a and 368b is determined by the critical dimensions. Accordingly, the distance between the imaginary 368a and the vertical side surface 194A of the source/drain feature 110A is about 1 nm to about 30 nm. The angle $\theta_A$ is designed to optimize and balance between a larger overall contact surface area (e.g. on the top surfaces 190A, canted side surfaces 192A, and the vertical side surfaces 194A) and reducing the shorting risk with adjacent source/drain features. In some embodiments, the angle $\theta_A$ is about 30° to about 90°. If the angle $\theta_A$ is too small, such as less than 30°, or too large, such as greater than 90°, it may be challenging to achieve such optimization and balance. The side surface 372A⁰ spans an angle $\theta_A{}^0$ from the Y-direction. The angle $\theta A^0$ may be the same as or different from the angle $\theta_A$. In other words, the side surfaces 372A and the side surface 372A⁰ may have the same or different slopes. In the depicted embodiments, they have the same slope.

Similarly, the contact trench 142B has a lateral dimension 364B along the Y-direction at the half-height level of the contact trench 142B, and have a depth 366B along the Z-direction. The lateral dimension 364B and the depth 366B may be similar to or different from the lateral dimension 364A and the depth 366A of the contact trench 142A, respectively. Moreover, as illustrated in FIG. 2, the side surface 372B of the contact trench 142B extends along an imaginary extension surface 372B'. The side surface 372B and consequently the imaginary extension surface 372B' may be canted from the Y-direction. For example, the side surface 372B and the imaginary extension surface 372B' may span an angle $\theta_B$ from the Y-direction. In some embodiments, the imaginary extension surface 372B' extends downwards passing the entire canted side surface 192B without interfacing with the canted side surface 192B. Accordingly, a subsequently deepened contact trench 142B encompasses the entire canted side surface 192B. As a result, a subsequently formed contact in the deepened contact trench 142B has an interface with the source/drain feature 110B that includes the entirety of the canted surface 192B. In other words, a larger contact surface area, and consequently lower contact resistance may be achieved between the contact and the source/drain feature 110B. In some embodiments, the imaginary extension surface 372B' extends further downwards passing the entire vertical side surface 194B without interfacing with the vertical side surface 194B. Accordingly, the subsequently formed contact further interfaces with source/drain feature 110B on the entirety of the vertical side surface 194B, such that the contact surface area with the source/drain feature 110B is further increased and the contact resistance is further reduced. However, this present disclosure contemplates situations where the imaginary extension surface 372B' interfaces with the top surface 190B, with the canted side surface 192B, with the vertical side surface 194B, or does not interface with any of these surfaces. The angle $\theta_B$ is designed to optimize and balance between larger overall contact surface areas with the source/drain features 110B (e.g. on the top surfaces 190B, canted side surfaces 192B, and the vertical side surfaces 194B) and reducing the shorting risk with adjacent source/drain features. In some embodiments, the angle $\theta_B$ is about 30° to about 90°. If the angle $\theta_B$ is too small, such as less than 30°, or too large, such as greater than 90°, it may be challenging to achieve such an optimization and balance. Furthermore, the contact trench 142B includes another side surface 372B⁰, which spans an angle $\theta_B^0$ from the Y-direction. The angle $\theta_B^0$ may be the same as or different from the angle $\theta_B$. In other words, the side surfaces 372B and the side surface 372B⁰ may have the same or different slope. In the depicted embodiments, they have the same slope. Additionally, although not specifically depicted, there may be other source/drain features adjacent the source/drain features 110A and/or 110B. Accordingly, the angles and dimensions of the contact trenches 142A and 142B are further designed to avoid a shorting risk with those other source/drain features, similar to those described above with respect to the imaginary extension surface 372A' and distance 368b.

Any suitable methods may be used to form the contact trenches 142A, 142B. In some embodiments, a patterned photoresist layer 130 is formed over the IC device 100. The patterned photoresist layer 130 have openings designed based on the dimension requirement of the contact trenches 142A and 142B, as described in detail below. The patterned photoresist layer 130 may be formed by lithography process that includes photoresist coating, exposure to ultraviolet (UV) radiation, and developing process. A hard mask 132, such as silicon nitride, or other suitable material, may be further used. In this scenario, the openings of the patterned photoresist layer 130 is first transferred to the hard mask 132 by etch. Then, an etching process 400, such as dry etching, wet etching or a combination thereof, is conducted to remove the exposed portions of the ILD layer 108 to form the trenches 142A, 142B. The etching process may include one or more etching steps. In the depicted embodiments, the etching operation 400 is conducted in time mode. In other words, the depth of etching is controlled by adjusting a time duration of the etching operation 400. After the etching operation 400 is concluded, the hard mask 132 and the patterned photoresist layer 130 are removed.

Referring to FIG. 3 and block 206 of FIG. 9, the contact trenches 142A and 142B are deepened and/or widened by etching operation 420 to form contact trenches 142-1 and 142-2, respectively. For example, the contact trench 142A becomes a portion of the contact trench 142-1; and the contact trench 142B becomes a portion of the contact trench 142-2. Accordingly, the contact trench 142A is also interchangeably referred to as the contact trench portion 142A; and the contact trench 142B is also interchangeably referred to as the contact trench portion 142B. In the depicted embodiments, the contact trench 142-1 includes an additional trench portion 142C on the bottom surface of the contact trench portion 142A. Moreover, contact trench 142-1 further includes a contact trench portion 142D from a side surface (e.g. side surface 372A, see FIG. 3) of the contact trench portion 142A. In the depicted embodiments, the contact trench portion 142C has a side surface 372C that extends along the imaginary extension surface 372A'. In other words, the side surface 372C aligns with the side surface 372A. The contact trench portion 142C has a depth dimension 366C. Accordingly, the contact trench 142-1 has a depth dimension 366, that equals the sum of the depth dimension 366A of the contact trench portion 142A and the depth dimension 366C of the contact trench portion 142C. In some embodiments, the depth dimension 366C is about 5 nm to about 15 nm. If the depth dimension 366C is too large, the increase in the size of the subsequently formed contact feature does not provide sufficient benefit to justify its additional fabrication costs; if the depth dimension 366C is too small, the interface between the subsequently formed contact feature and the source/drain feature 110A may not have been maximized, hence the contact resistances may not have been minimized. Furthermore, the contact trench portion 142C has a width dimension 364C along the Y-direction between the side surface 194A (see FIG. 3) of the source/drain feature 110A and the side surface 372C of the contact trench portion 142C, for example, at the bottom surface of the contact trench portion 142C. The width dimension 364C may be about 1 to about 30 nm. If the width dimension 364C is too large, such as greater than about 30 nm, the contact trench portion 142C may approach the adjacent source/drain feature 110B. If the width dimension 364C is too small, such as less than 1 nm, variation in processing may cause the contact trench portion 142C to cover a smaller portion of the source/drain feature surface than designed. Accordingly, the contact resistance between the source/drain feature and the subsequently formed contact may not be minimized.

Additionally, with the etching operation 420, the contact trench portion 142D is formed on a side surface of the contact trench portion 142A. In other words, the formation of the contact trench portion 142D widens the contact trench. In the depicted embodiments, the contact trench portion 142D is formed adjacent the source/drain feature 110B and the contact trench portion 142B. For example, a section of the contact trench portion 142D may protruding out to be vertically over the source/drain feature 110B along the Z-direction. In other words, the contact trench portion 142D may include a section that overhangs the source/drain trench 110B. In some embodiments, the contact trench portion 142D has a substantially straight side (or bottom) surface 372D that extends from the side surface 372A of the contact trench portion 142A to the top surface of the ILD layer 108. In some embodiments, the contact trench portion 142D has a depth dimension 366D. In other words, a maximum distance between the top surface of the ILD layer 108 and the bottom (or side) surface 372D is the depth dimension 366D. The depth dimension 366D is less than or about the same as the depth dimension 366A. In some embodiments, the depth dimension 366D is about 1 nm to about 20 nm, for example, about 5 nm to about 15 nm.

In some embodiments, the contact trench portion 142D has a maximum width dimension 364D along the Y direction, for example, at a top surface of the contact trench portion 142D. In other words, a maximum distance along the Y direction between the imaginary line 372A' and the side surface 372D is the width dimension 364D. In some embodiments, the width dimension 364D is about 1 nm to about 20 nm, for example, about 5 nm to about 15 nm. Moreover, the side surface 372D spans an angle $\theta_D$ from the top surface of the ILD layer 108. The angle $\theta_D$ is less than the angle $\theta_A$. In other words, the slope of the side surface 372D is less than the slope of the side surface 372A$^O$ and the remaining portions of the side surface 372A. In some embodiments, the angle $\theta_D$ may be about 20° to about 85°. Therefore, as illustrated in FIG. 3, the contact trench 142-1 has asymmetric side surfaces, where the side surface extending between the source/drain feature 110A and the adjacent source/drain feature 110B has a different profile from the side surface on an opposing side of the source/drain feature 110A (such as the side surface that directly interfaces with the top surface of the source/drain feature 110A). Moreover, the side surface that extends between the two source/drain features includes two segments, 372D and 372A; while the side surface on the opposing side includes only one segment, 372A$^O$. Furthermore, one of the segments, the side surface 372D, has a slope less than the other segment, side surface 372A, and less than the side surface 372A$^O$.

As described later, these parameters allow the contact trench 142-1 to have a greater overall width dimension, on the top surface, along the Y direction without protruding onto adjacent source/drain features, such as source/drain feature 110B, or adjacent contact trenches, such as contact trench 142-2. For example, a larger depth dimension 366D may result in a larger top surface area of the contact trench portion 142D, and consequently, a larger top surface area of the contact trench portion 142-1. As described in more detail later, a larger top surface area of a contact feature formed in the contact trench portion 142-1 is beneficial to the minimizing of the contact resistance between the contact feature and a subsequently formed via feature thereon. On the other hand, if the depth dimension 366D is too large, there may be significant risks that the side surface 372D may reach the adjacent source/drain feature 110B. Similarly, larger width dimension 364D may increase the area for the top surface of the subsequently formed contact; yet a width dimension 364D that is too large may reach adjacent contact trench 142-2 thereby causing shorting risks. Furthermore, a smaller angle $\theta_D$ may provide a larger top surface area to the contact subsequently formed in the contact trench 142-1 and improve contact resistance with via features formed thereon. However, if the angle $\theta_D$ is too small, the contact trench 142-1 may approach the adjacent contact trench 142-2 and cause shorting concerns.

Figure 4:
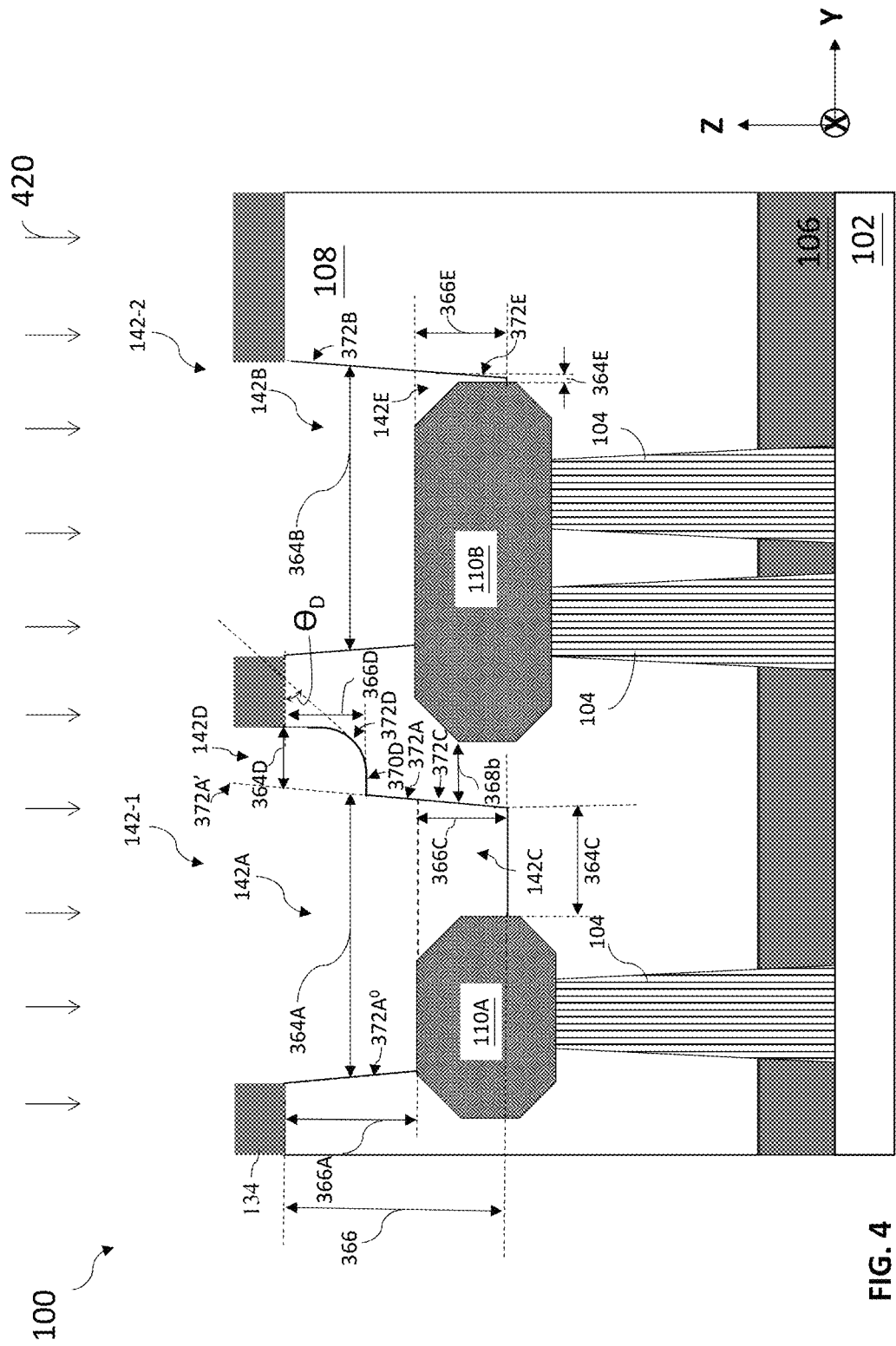

Alternatively, referring to FIG. 4, the contact trench portion 142D may have a curved (rather than straight) surface 372D. In such embodiments, curved side surface 372D still includes segments that span the angle $\theta_D$ from the top surface of the ILD layer 108. The angle $\theta_D$ is less than the angle $\theta_A$. Accordingly, the curved side surface 372D includes segments that have slopes less than the slope of the side surface 372A$^O$ and the remaining portions of the side surface 372A. The side surface 372D may further includes segments of other slopes. As further described later, the present disclosure contemplates the side surface 372D to have any other suitable profiles.

The process 420 may implement any suitable methods, for example, similar methods as described above with respect to the process 400. For example, a mask element 134 may be implemented to facilitate the etching operation 142. Here, the mask element 134 covers different regions of the substrate from that of the mask element 132 described above. For example, the masking element 134 includes openings that are wider or offset from those of the hard mask 132, and consequently, the contact trenches 142A. As a result, the etching operation 420 widens and deepens the contact trench over the source/drain feature 110A. In some embodiments, the masking element 134 in the region over the source/drain feature 110B has an opening that approximately matches those of the hard mask 132. Accordingly, the process 420 further deepens (but not widens) the contact trench 142B. For example, after the process 420, the contact trench 142B is deepened into the contact trench 142-2, where a new contact trench portion 142E is formed from a bottom surface of the contact trench portion 142B. The contact trench portion 142E has a lateral width 364E and a height dimension 366E. This present disclosure contemplates the masking element 134 to include openings of any suitable size, profile, and location in the area over the source/drain feature 110B. In some embodiments, the process 420 is conducted in time mode. Therefore, while the widths of the contact trenches 142-1 and 142-2 are controlled by the masking element 134; the depths of the contact trenches 142-1 and 142-2 are controlled by the time duration for the etching operation 420.

Figure 5:
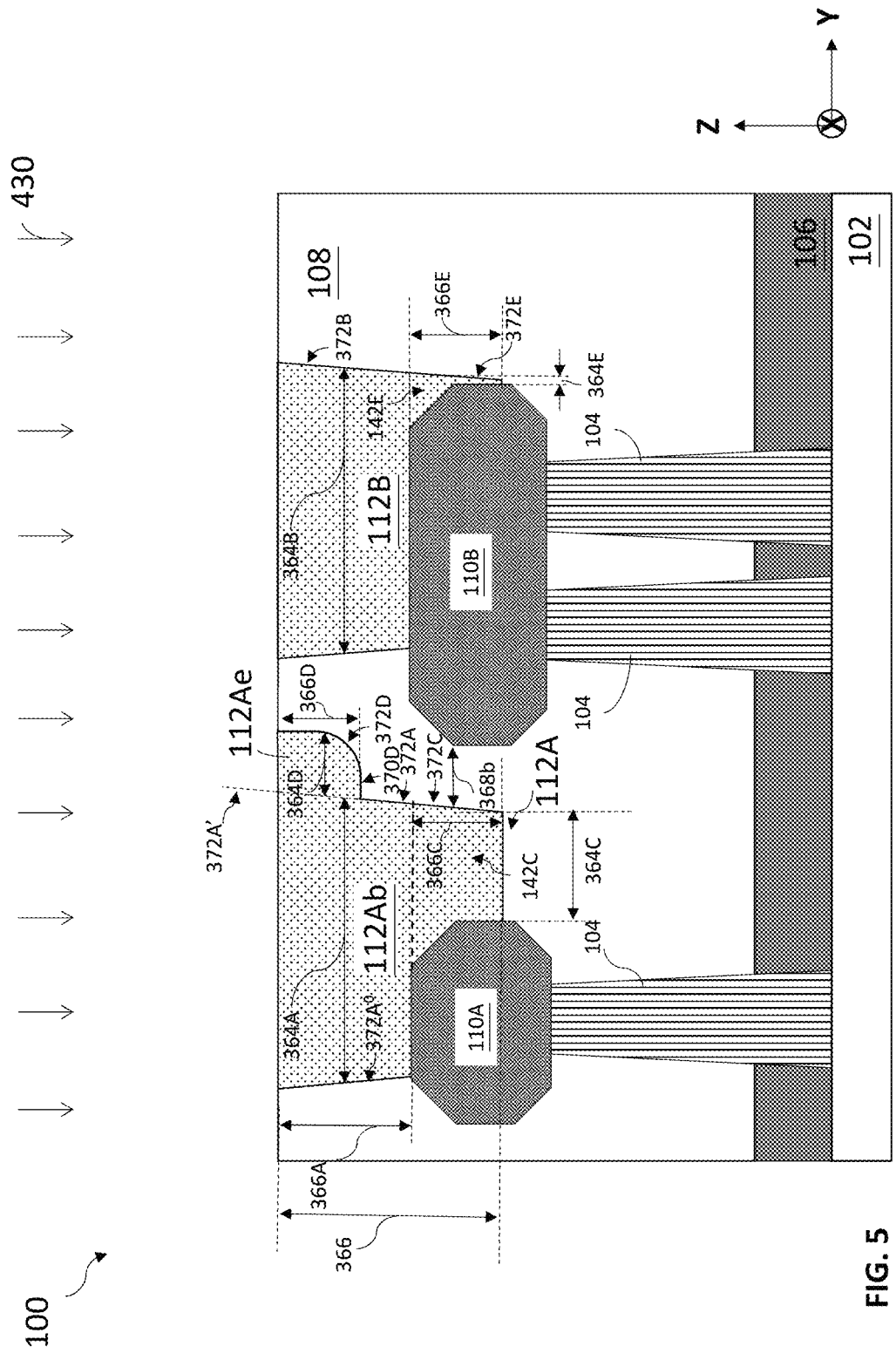

Referring to FIG. 5 and block 208 of FIG. 9, a metal layer is deposited into the contact trenches 142-1 and 142-2, such that the metal layer fills the respective trenches, forming contacts (or contact features) 112A and 112B, respectively. In some embodiments, the metal layer includes tungsten (W), copper (Cu), aluminum (Al), ruthenium (Ru), cobalt (Co), gold (Au), silver (Ag), other suitable metals, suitable metal alloys, or combinations thereof. The contacts 112A and 112B may be deposited by any suitable methods, such as CVD, PVD, ALD, HDPCVD, MOCVD, RPCVD, PECVD, LPCVD, ALCVD, APCVD, or combinations thereof. In some embodiments, the metal layer overfills the contact trenches 142-1 and 142-2, and subsequently, a Chemical Mechanical Polishing (CMP) process may be employed to remove excess metal layer material over the ILD layer 108 and planarize the top surface. Moreover, in some embodiments, a barrier layer is formed in the contact trenches 142-1 and 142-2 prior to the deposition operation. Accordingly, the barrier layer interposes between the contacts 112A, 112B and the source/drain features 110A, 110B, respectively. In the depicted embodiments, the contact 112A is formed on the top surface 190A, canted side surface 192A, and vertical side surface 194A of the source/drain feature 110A; and the contact 112B is formed on the top surface 190B, canted side surface 192B, and vertical side surface 194B of the source/drain feature 110B. The portion of the contact 112A that fills the contact trench portions 142A and 142C are collectively referred to as the bulk portion 112Ab of the contact 112A; while the portion of the contact 112A that fills the contact trench portion 142D is referred to as the extension portion of the contact 112A. The extension portion may also interchangeably referred to as a step, a protrusion, an overhanging portion, or other similar terms. The bulk portion 112Ab and the extension portion 112Ae interface with each other at the imaginary line 372A'. As described above, the side surface 372D may be straight (see FIG. 3) or curved (see FIG. 4). Accordingly, the extension portion 112Ae may include a side surface facing the source/drain feature 110B that is either straight or curved. Here, FIG. 5 and subsequent figures illustrate the example situation that proceeds from the embodiment depicted in FIG. 4 where the side surface 372D is curved. However, the present disclosure contemplates the extension portion 112Ae of the contact 112A to have a straight side surface, or any other suitable side surface profiles. In some embodiments, the contact 112A is spaced away from the adjacent source/drain feature 110B by the distance 368b.

Figure 6:
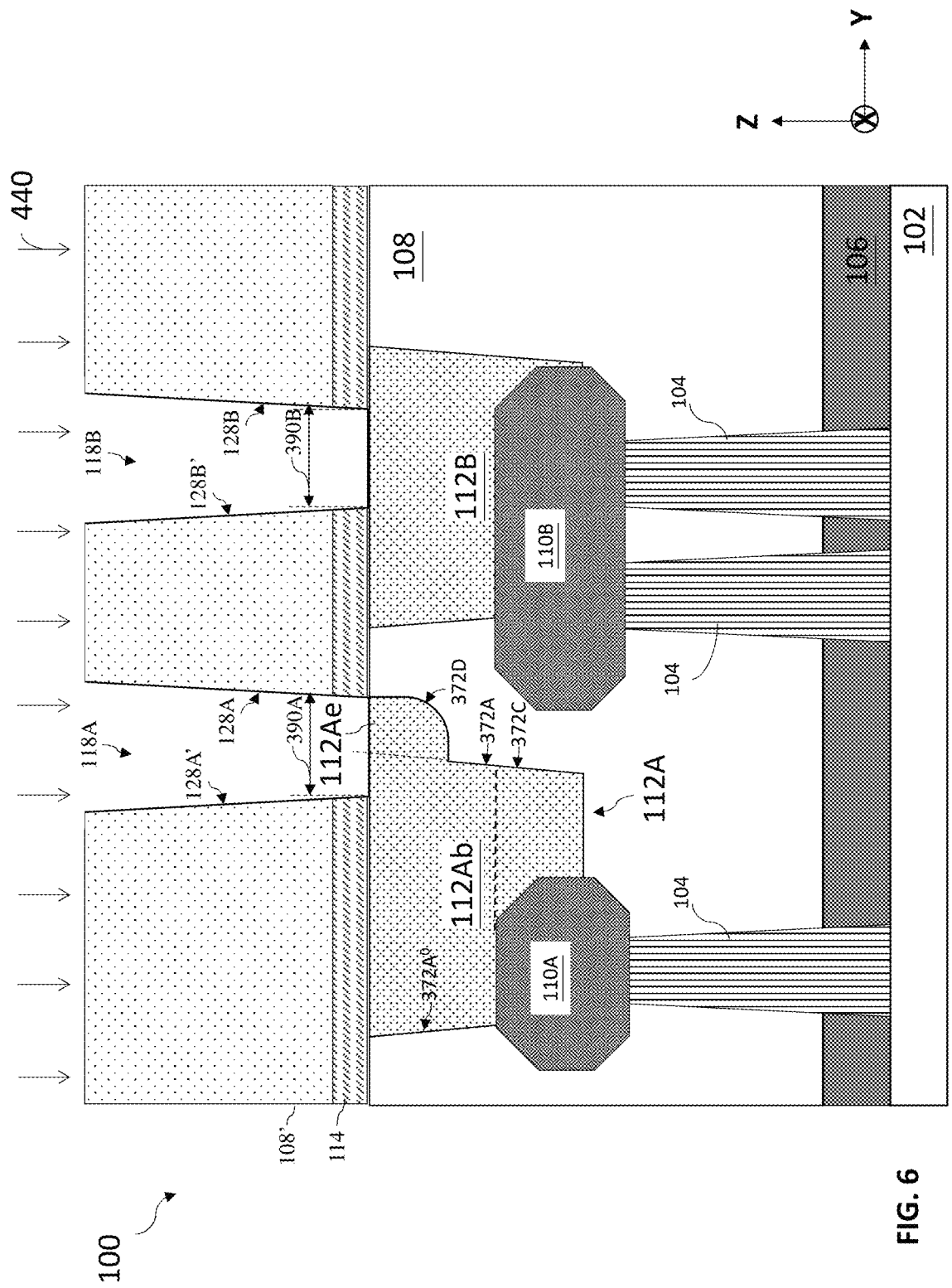

Referring to FIG. 6 and block 210 of FIG. 9, an etch stop layer 114 is formed over the IC device 100. For example, the etch stop layer 114 is formed on top surfaces of the contacts 112A and 112B. The etch stop layer 114 protects the device features not intended to be etched in a subsequent etching process. An ILD layer 108' is then formed over the etch stop layer 114. Subsequently, referring to FIG. 6 and to block 212 of FIG. 9, a via trench 118A is formed over the contact 112A, and a via trench 118B is formed over the contact 112B in the etching operation 440. The via trenches 118A and 118B extend through the ILD layer 108' as well as the etch stop layer 114 to expose the top surfaces of the source/drain contacts 112A and 112B, respectively. The via trenches 118A and 118B may be formed by any suitable methods. In some embodiments, a patterned photoresist layer and/or a hard mask layer, along with a suitable etching process, such as a dry etching process, may be implemented to form the via trenches 118A and 118B.

In some embodiments, the bottom surfaces of the via trenches 118A and 118B each have a lateral dimension 390A and 390B, respectively. The lateral dimension 390A and 390B may each be about 5 nm to about 100 nm, for example, about 10 nm to about 15 nm. If the lateral dimensions 390A, 390B are too large, their lateral dimensions may exceed the corresponding dimensions of the overlaying metal lines. Where the overlaying metal lines are adjacent other conductive features, potential short circuit may form between those other conductive features and the via features formed in the via trenches 118A, 118B. If the lateral dimension 390A, 390B are too small, the resistances within the via features may be too high and may pose as a bottleneck for the device speed.

In some embodiments, the via trench 118A is formed entirely on the top surface of the contact 112A. In other words, the side surfaces 128A and 128A' of the via trench 118A each extend from the top surface of the contact 112A, and not from the top surface of the ILD layer 108. In some embodiments, at least one of the side surfaces, such as the side surface 128A, extends from inside the top surface of the extension portion 112Ae, and outside the top surface of the bulk portion 112Ab. In other words, at least a portion of the extension portion 112Ae is exposed in the via trench 118A. In some embodiments, the side surface 128A aligns with the side surface 372D. Moreover, in some embodiments, the via trench 118A exposes primarily the top surface of the extension portion 112Ae of the contact 112A. For example, more than half (50%) of the exposed top surface of the contact 112A (measured by lateral dimension along the Y-direction) is part of the extension portion 112Ae; while less than half (50%) of the exposed top surface of the contact 112A is part of the bulk portion 112Ab. In some embodiments, the entirety of the exposed top surface of the contact 112A is part of the extension portion 112Ae. In other words, the via trench 118A is formed exclusively on the extension portion 112Ae. This may be beneficial when such location of the via trench 112A maximizes an interface (and thereby minimizes the contact resistances) between the subsequently formed via feature in the via trench 118A and subsequently formed metal line overlaying thereon. In such embodiments, in approaches not implementing methods of the present disclosure, for example, without forming the extension portion 112Ae, the via trench 118A may only be partially formed on the top surface of the contact 112A, or not formed on the top surface of the contact 112A at all. In other words, a subsequently formed via feature in the via trench 118A may not have simultaneously maximized contact surface areas with the contact 112A and with the overlaying metal line. By contrast, the extension portion 112Ae of the present disclosure provides increased top surface area for the contact 112A, such that the via feature formed in the via trench 118A has simultaneously maximized interface and minimized contact resistance with both the contact 112A and the metal line overlaying thereon. In the depicted embodiments, the via trench 118B is formed entirely on the top surface of the contact 112B. However, the present disclosure contemplates the via trench 118B being formed partially on the top surface of the contact 112B.

Figure 7:
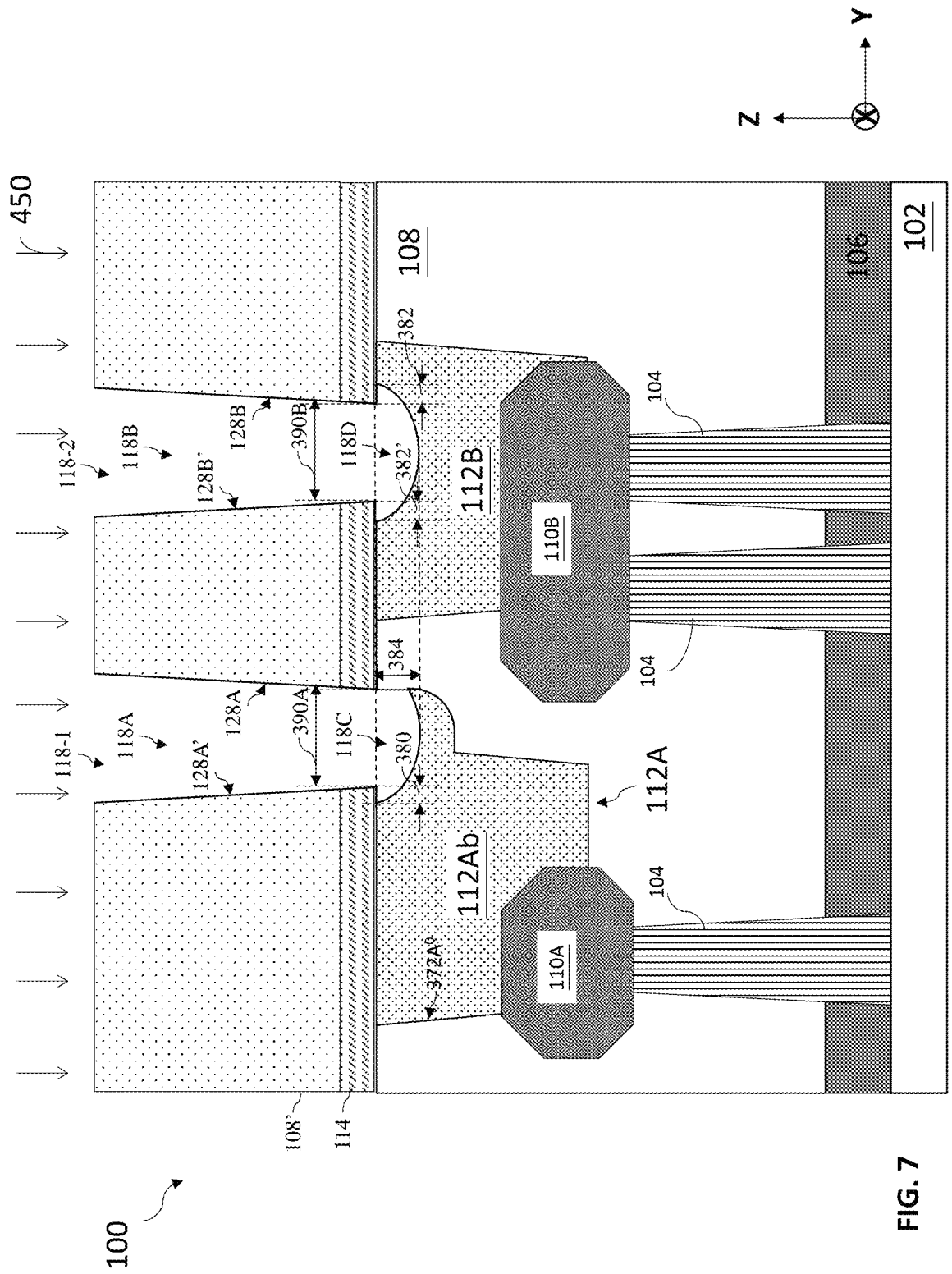

Referring to FIG. 7 and to block 214 of FIG. 9, another etching operation 450 is conducted to deepen the via trenches 118A and 118B. For example, trench portion 118C is formed from the bottom surface of the trench 118A. According, a combined via trench 118-1 is formed. The trench 118A becomes part of the trench 118-1 and is interchangeably referred to as the trench portion 118A. As described above, the trench portion 118A has a bottom surface with a width dimension 390A. In some embodiments, the trench portion 118C has a top surface wider than the bottom surface of the trench portion 118A and has a lateral width dimension greater than the width dimension 390A. For example, a wing section of the trench portion 118C extends along the bottom surface of the ILD layer 108 by a distance 380. In some embodiments, the distance 380 is about 1 nm to about 15 nm, for example, about 4 nm to about 8 nm. The via features subsequently formed in the via trenches 118-1 and 118-2 are generally thin and tall. Accordingly, when a polishing operation is later conducted to planarize the top surfaces of the via features, the shear force may unseat the via features. Here, the wing section provides an anchoring point embedded within the contact 112A and below the bottom surface of the etch stop layer 114 to secure the via features during such subsequent polishing operations. A secured via feature also have better electrical conductivity (and less resistance) for the operation current. If the distance 380 is too small, the anchoring point is not secure enough to fulfill its intended functionality. If the distance 380 is too large, any improvement may not justify the additional material and processing costs.

The via trench portion 118C has a depth dimension 384. In some embodiments, the via trench portion 118C has a depth dimension 384. In some embodiments, the depth dimension 384 is about 1 nm to about 20 nm, for example, about 6 nm to about 10 nm. If the distance 384 is too small, the anchoring feature described above may be too small or too thin to effectively secure the via feature. If the depth 384 is too large, the additional volume may not be worth the cost as compared to any further increase in benefit. Moreover, as described later, a larger depth 384 leads to thinner etched extension portion 112Ae. As a result, if the depth 384 is too large, the etched extension portion 112Ae may be too thin to provide the expected benefits.

As described above, in the depicted embodiments, the side surface 128A aligns with the side surface 372D (see FIG. 6). In other words, the via trench portion 118A extends from a point on the circumference of the extension 112Ae. Accordingly, the top surface of the via trench portion 118C has a dimension that equals the sum of dimension 390A and the distance 380. In other embodiments, the side surface 128A may alternatively extend from within an inside region (e.g. not from the circumference) of the extension 112Ae. Accordingly, the top surface of the via trench portion 118C has a dimension that is greater than the sum of the dimension 390A and the distance 380. As described above, the extension portion 112Ae, and in the depicted embodiments, the top portion of the bulk portion 112Ab is etched in the etching operation 450. In some embodiments, the via trench portion 118C has a curved bottom surface. For example, the etched extension portion 112Ae have a curved top surface and a curved bottom surface. In other words, the etched extension portion 112Ae has a crescent profile that resembles a tail shape, extending out from the bulk portion 112Ab (the "body" to which the tail attaches). However, the present disclosure contemplates the via trench portion 118C having any suitable profile. In some embodiments, the etching operation 450 only removes portions of the extension portion 112Ae and does not etch the bulk portion 112Ab. In the depicted embodiments, the side surface of the ILD layer 108 is exposed in the via trench portion one 118C. In some embodiments, the side surface of the ILD layer 108 is not exposed.

Meanwhile, the etching operation 450 also deepens the via trench 118B. For example, a via trench portion 118D is formed from the bottom surface of the via trench 118B, thereby forming the extended via trench portion 118-2. Accordingly, the via trench 118B becomes part of the via trench 118-2, and is referred to interchangeably as the via trench portion 118B. In some embodiments, the via trench portion 118D also has a top surface with a lateral dimension along the Y direction that is greater than the dimension 390B of the bottom surface of the trench portion 118B. For example, the via trench portion 118D has a section that extends beyond the side surface 128B, and along a bottom surface of the etch stop layer 114 by a distance 382. Moreover, the via trench portion 118D further has another section that extends beyond the side surface 128B' and along the bottom surface of the etch stop layer 114 by a distance 382'. In some embodiments, the distances 382 and 382' are the same as or different from each other, and are the same as or different from the distance 380. In the depicted embodiments, the via trench portion 118D has the depth dimension 384, the same as the depth dimension of the via trench portion 118C. However, this present disclosure contemplates the via trench portion 118D having a depth that is different from the depth dimension of the via trench portion 118C. Accordingly, the via trench portion 118D has two anchoring points on both sides of the via trench portion 118B. Accordingly, a subsequently formed via feature in the via trench 118-2 includes two anchoring features.

The via trench portions 118C and 118D can be formed by any suitable methods. In some embodiments, the via trench portions 118C and 118D are formed by an isotropic etching method, such as a wet etching method. In some embodiments, the depth 384 and the width dimensions 380, 382, and 382' are controlled by a time duration of the isotropic etching method. It is noted that, although the figures illustrate the via trench 118-1 includes one anchoring point of a crescent profile and the via trench 118-2 includes two anchoring points of crescent profiles, the present disclosure contemplates the via trenches 118-1 and 118-2 each independently include any number of anchoring features, each having any suitable profiles. For example, in some embodiments (other pictured), the via trench portions 118C may instead have a profile that resembles the profile of the via trench portion 118D. In other words, a subsequently formed via feature in the trench portion 118-1 may also have two anchoring features as well. The anchoring features may have the same or different sizes from each other.

Figure 8:
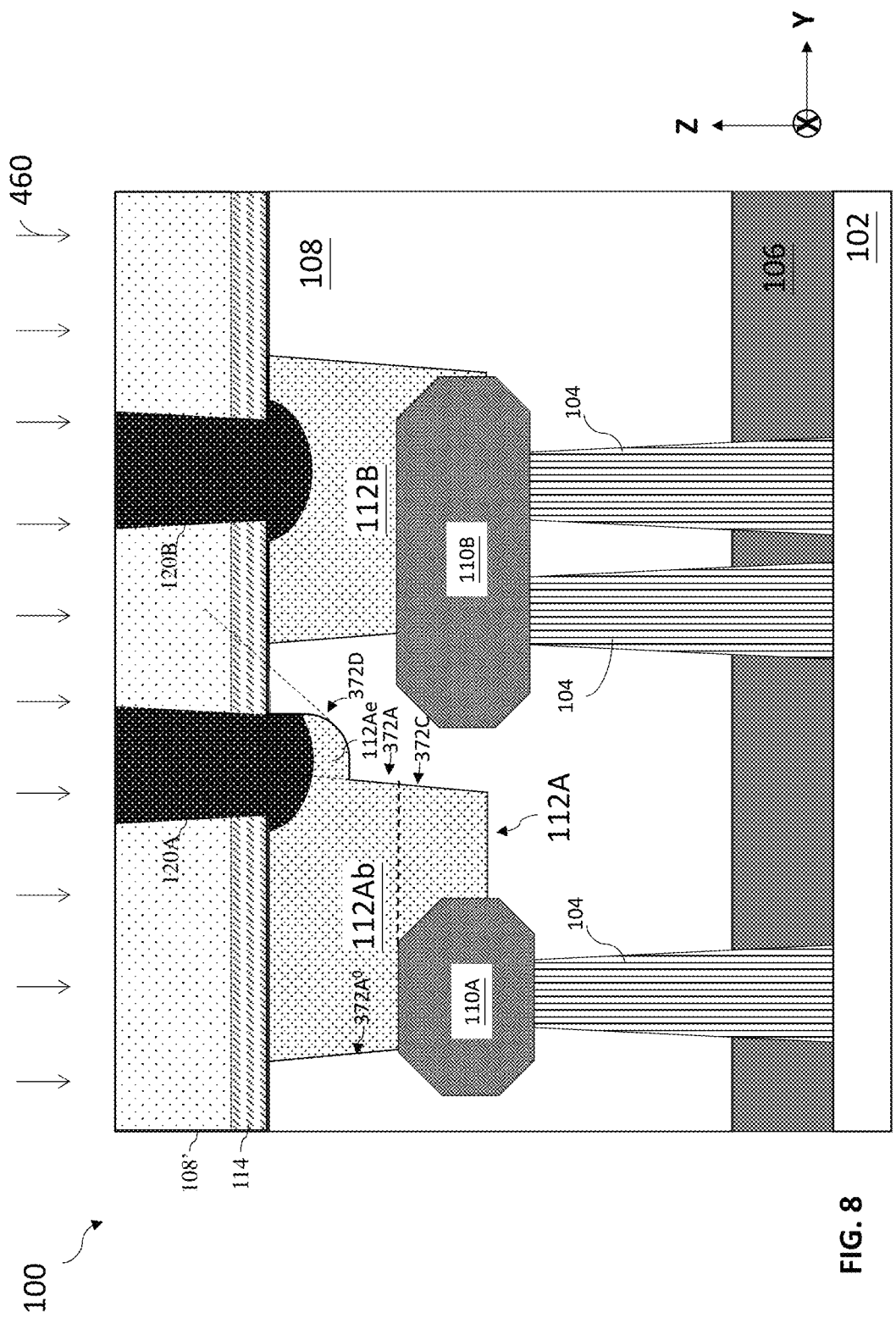
Figure 9:
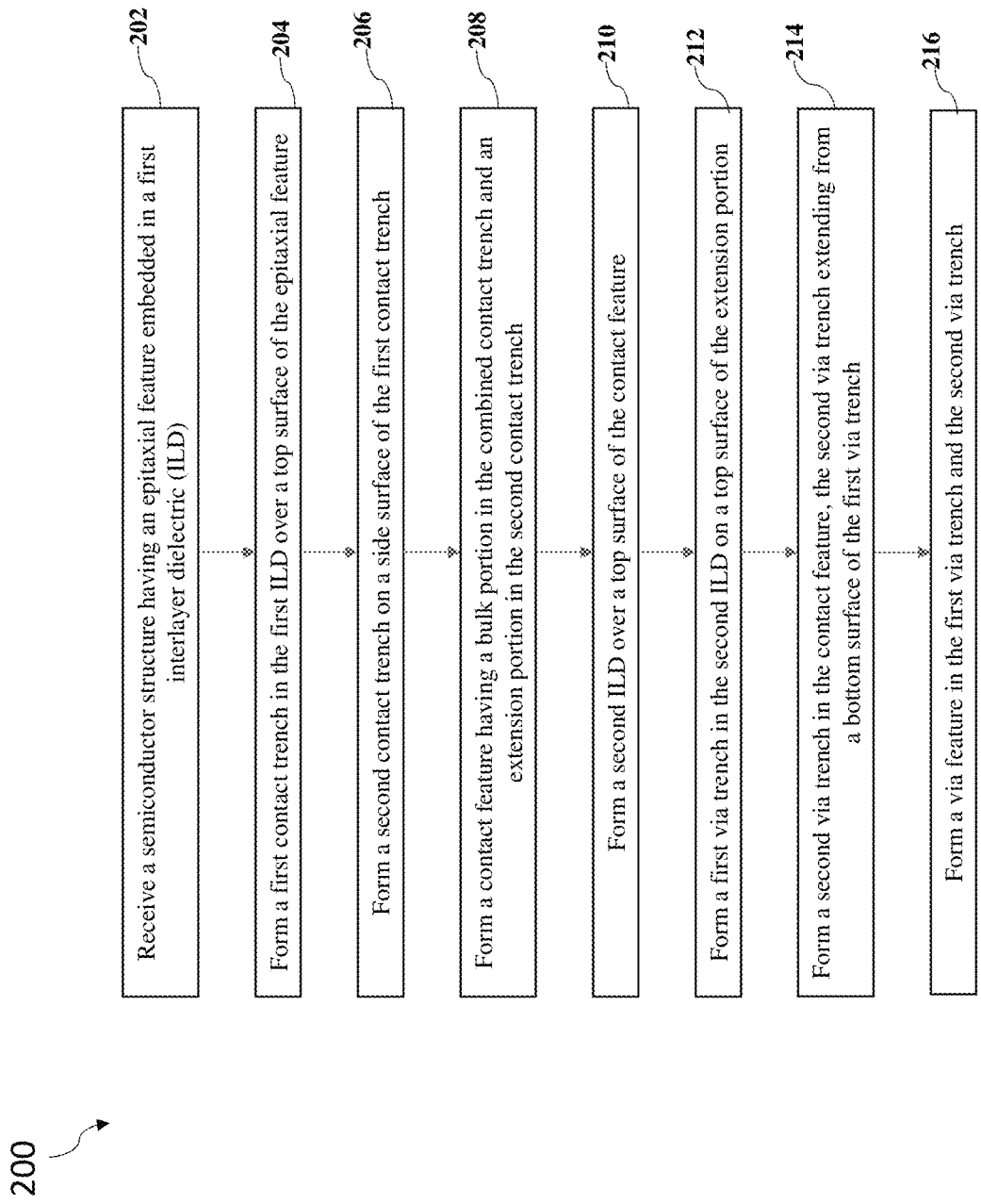

Referring to FIG. 8 and to block 216 of FIG. 9, a metal layer is deposited into the via trenches 112-1 and 112-2 in a deposition operation 460, thereby forming the via features 120A and 120B, respectively. Accordingly, the via feature 120A is formed on the top surface of the contacts 112A, for example, at the top surface of the crescent (or tail) profile. In the depicted embodiments, the via feature 120A is formed primarily on the extension portion 112Ae of the contact 112A. For example, over 50% of the via feature 120A (measured by the width dimension along the Y-direction) is formed vertically over (along the Z-direction) the extension portion 112Ae, and less than 50% of the via feature 120A is formed to vertically over the bulk portion 112Ab. In some embodiments, a CMP process is conducted to remove excess materials of the metal layer and the ILD layer 108', as well as to planarize the top surface of the device 100.

FIGS. 10-16 provide embodiments of the method 200 alternative to those already described above with respect to FIGS. 1-8. FIG. 17 is a flow chart illustrating these embodiments. Although the features of FIGS. 10-16 are marked with similar reference numerals to those of FIGS. 1-8, in some embodiments, these features may include different dimensions, profiles, and/or other suitable characteristics from those described with reference to FIGS. 11-8.

Figure 10:
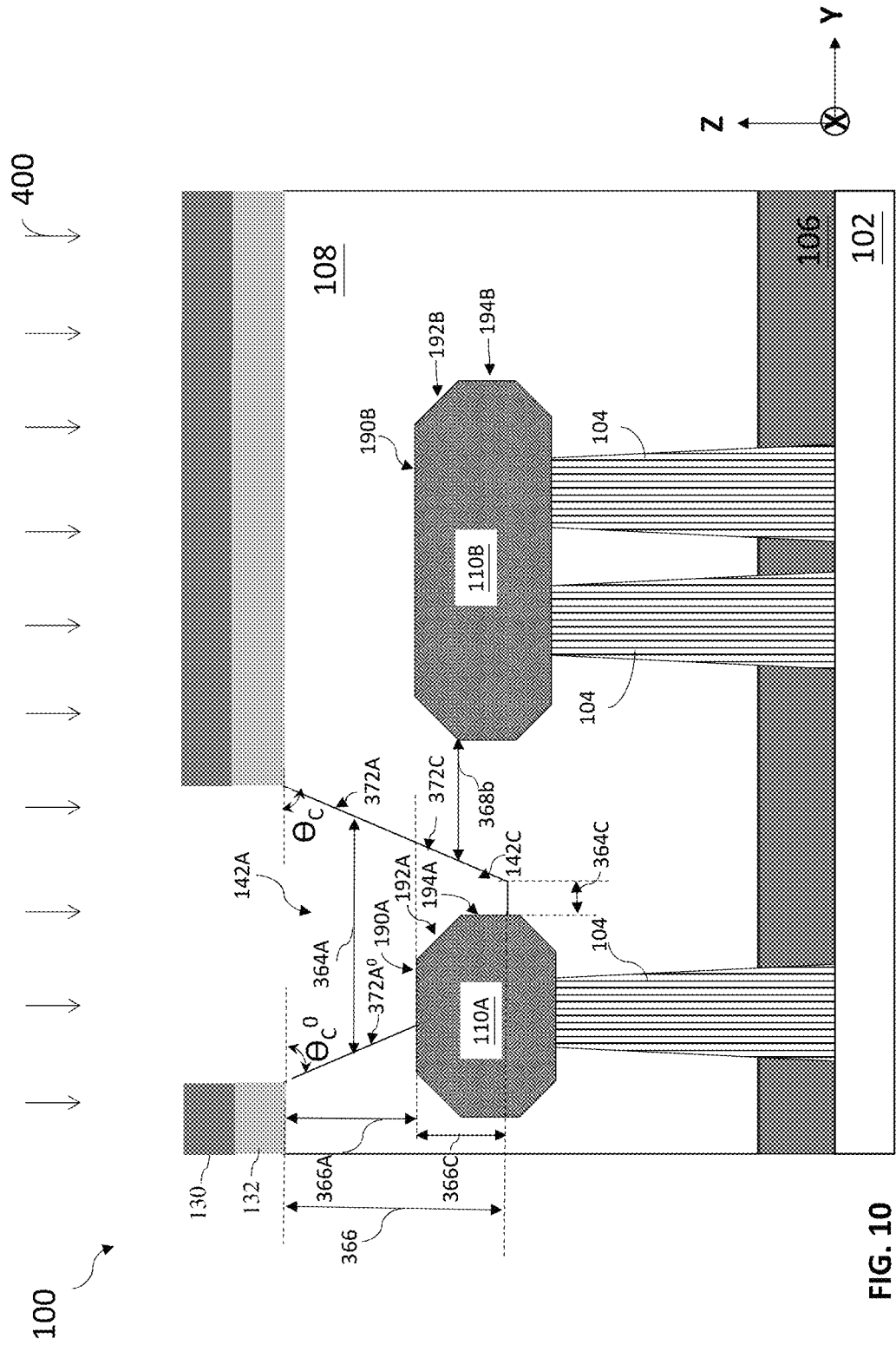
Figure 18:

Referring to block 202 of FIG. 18, an initial structure for the IC device 100 is received. The initial structure may be the same as or similar to the initial structure of FIG. 1. The method 200 proceeds to form an expanded contact trench over the source/drain feature 110A. Referring to FIG. 10 and block 204 of FIG. 18, a hard mask layer 132 is formed over the initial structure. A photoresist layer 130 is formed over the mask layer 132. In some embodiments, the hard mask layer 132 and photoresist layer 130 may each includes materials that resemble the hard mask layer 132 and photoresist layer 130 described above with respect to FIG. 3. In the depicted embodiment, the photoresist layer 130 only has an opening over the source/drain feature 110A, and not over the source/drain feature 110B. Accordingly, the hard mask layer 132 similarly only have an opening over the source/drain feature 110A. An etching operation 400 is conducted to form a source/drain trench. In the depicted embodiments the source/drain trench includes of contact trench portion 142A and a contact trench portion 142C. In some embodiments, the source/drain trench 142A and 142C each resemble the source/drain trench portions 142A and 142C described above with respect to FIG. 3. For example, the contact trench portion 142A is formed on the top surface of the source/drain feature 110A; while the contact trench portion 142C is formed on a sidewall surface source/drain feature 110A. In some embodiments, the contact trench portion 142A has a depth dimension 366A, and has a lateral width 364A. In some embodiments, the depth dimension 366A may be about 10 nm to about 60 nm, for example, about 20 nm to about 40 nm; and the lateral dimension 364A may be about 10 nm to about 60 nm, for example, about 20 nm to about 30 nm. If the depth dimension 366A is too large, the device may suffer increased contact resistance (the "vertical contact resistance") to the source/drain features; conversely, if the depth dimension 366A is too small, the device may instead suffer higher lateral resistance. If the lateral dimension 364A is too large, such as larger than about 60 nm, the spacing from adjacent source/drain features may be too small to avoid shorting; conversely, if the lateral dimension 364A is too small, such as less than about 10 nm, there may be insufficient amount of charge carrier available to form the current, thereby adversely affecting the current. Similarly, the contact trench portion 142C has a depth dimension 366C, and has a lateral width 364C. In some embodiments, the depth dimension 366C may be about 5 nm to about 15 nm; and the lateral width 364C is about 1 nm to about 30 nm. If the depth dimension 366C is too large, the increase in the size of the subsequently formed contact feature does not provide sufficient benefit to justify its additional fabrication costs; if the depth dimension 366C is too small, the interface between the subsequently formed contact feature and the source/drain feature 110A may not have been maximized. Moreover, side surface 372A spans an angle for $\theta_C$ from a top surface of the contact trench portion 142A (which extends along, for example, the top surface of the ILD layer 108). In the depicted embodiments, the side surface 372C aligns with the side surface 372A. Accordingly, the side surface 372C similarly spans the angle $\theta_C$ from the top surface of the contact trench portion 142A. Moreover, the opposing side surface 372A$^0$ spans an angle $\theta_C^0$ from the top surface of the contact trench portion 142A. The angles $\theta_C$ and angle $\theta_C^0$ may be the same as or different from each other. Furthermore, the angles $\theta_C$ and angle $\theta_C^0$ may be less than the angles $\theta A$ and angle $\theta A^0$, respectively. As further explained below, the smaller angles allow the subsequently expanded contact trench to have greater lateral dimension on the top surface. In some embodiments, the angles $\theta_C$ and angle $\theta_C^0$ may be about 20° to about 85°. If the angle stated $\theta_C$ is too small, such as less than about 20°, the contact trench portion 142A and subsequently formed contact feature therein may approach adjacent conductive features and cause shorting concerns. If the angle is too large, such as greater than about 85°, the surface area increase associated with implementing the method may not be significant enough to justify the extra processing steps. The etching operation 400 may implement any suitable etching methods, such as a dry etching, a wet etching method, or combinations thereof. In some embodiments, parameters for the etching operation 400 is adjusted at least in part based on the requirement on the angles $\theta_C$ and angle $\theta_C^0$. In some embodiments, the etching operation 400 is conducted in time mode. After the etching operation 400 is completed and the trench portions 142A and 142C are formed, the hard mask layer 132 and the photoresist layer 130 are removed.

Figure 11:
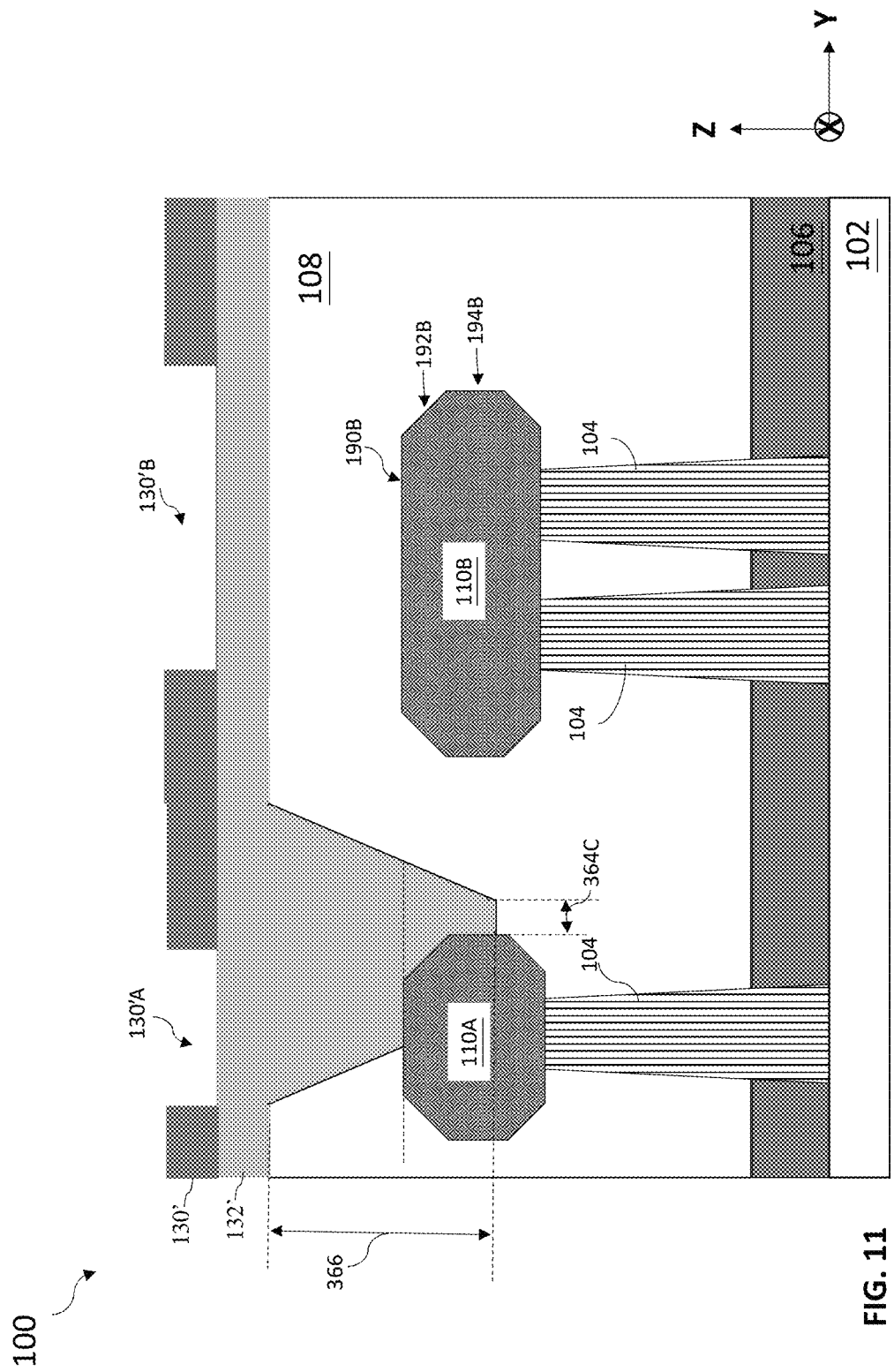
Figure 12:
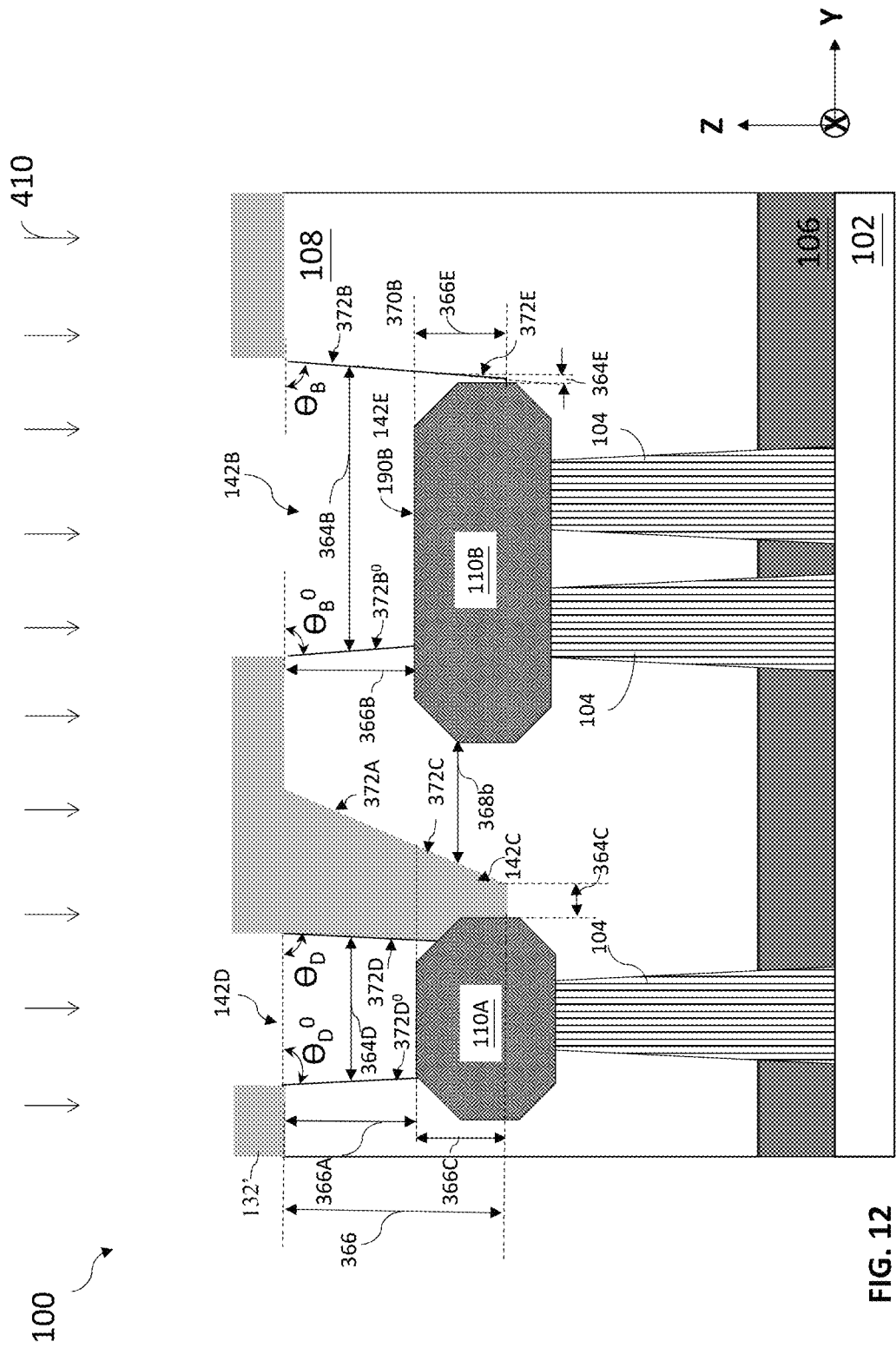
Figure 13:
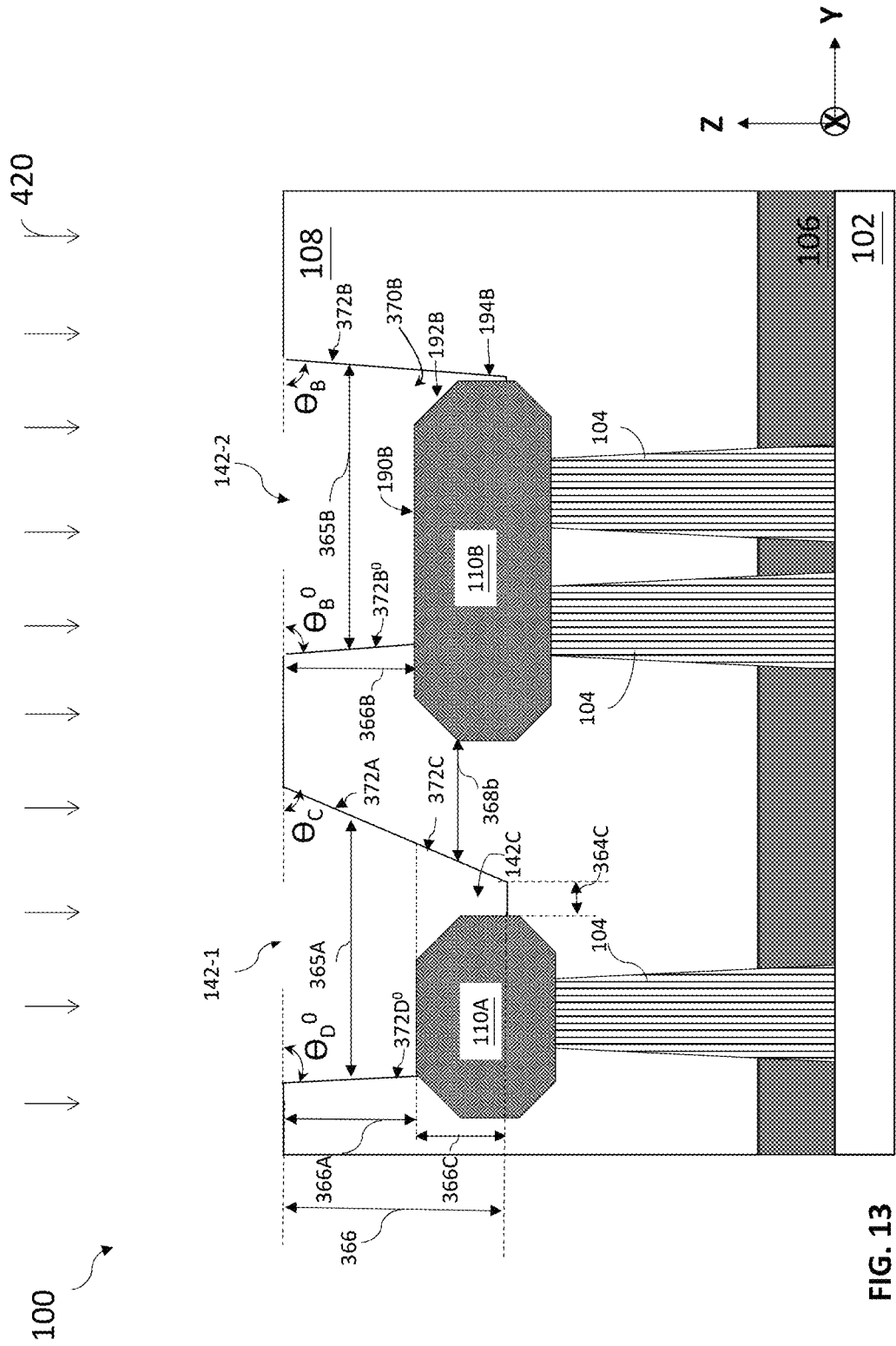

As illustrated in the FIG. 10, the source/drain trench portions 142A exposes only a portion (and not the entirety) of the top surface 190A of the source/drain feature 110A. Accordingly, the contact feature subsequently formed the contact trench 142A interfaces with the source/drain feature 110A only on a portion of the top surface 190A. In other words, the interface is not maximized, and hence the contact resistance is not minimized. Referring to FIGS. 11-13 and to block 206 of FIG. 18, the source/drain trench is expanded to increase the surface area of this interface. More specifically, referring to FIG. 11, the hard mask layer 132' is formed over the IC device 100, including in the contact trench portions 142A and 142C. Moreover, a photoresist layer 130' is further formed over the top surface of the hard mask layer 132'. The photoresist layer 130' has an opening 130'A vertically over the source/drain feature 110A (e.g. along the Z-direction) and an opening 130'B vertically over the source/drain feature 110B. The opening 130'A overlaps with the top surface of the contact trench 142A (which is now filled with the hard mask 132'). In the depicted embodiments, the entirety of the opening 130'A is vertically above the filled contact trench portion 142A. However, in some embodiments, the opening 130'A may be offset from the filled contact trench portion 142A along the Y-direction. As explained below, the size, dimension, and location of the opening 130'A partially determines the lateral dimensions of the contact trench on the source/drain feature 110A.

Referring to FIG. 12 and block 206 of FIG. 18, an etching operation 410 is conducted to transfer the pattern of the photoresist layer 130' onto the IC device 100. In some embodiments, the etching operation 410 may implement an anisotropic etching method such as a dry etching method. Accordingly, the hard mask layer 132' and the of ILD layer 108 exposed in openings 130'A and 130'B are removed. In some embodiments, the etching operation 410 is configured such that there is an etching selectivity between the dielectric material of the ILD 108 and the hard mask layer 132' as compared to the epitaxial material of the source/drain features 110A and 110B. Accordingly, the etching operation 410 does not affect the source/drain features 110A and 110B. In some embodiments, the etching operation 410 is conducted in end-point mode. Therefore, the top surface and portions of the side surfaces of the source/drain features 110A and 110B are exposed in the newly formed trench portions 142D over the source/drain feature 110A and in the newly formed trench portion 142B over the source/drain feature 110B. As described in detail later, the portion of the top surface 190A exposed in the contact trench portion 142D extends beyond the portion exposed in the contact trench portion 142A prior to the forming of the hard mask layer 132' (see FIG. 10).

The via trench portion 142D has a side surface 372D and an opposing side surface 372D$^0$. In some embodiments, the side surface 372D spans an angle $\theta_D$ from the top surface of the ILD layer 108. And the side surface 372D$^0$ spans an angle $\theta_D^0$ from the top surface of ILD layer 108. The angle $\theta_D$ and the angle $\theta_D^0$ may be the same or different from each other. Moreover, the etching operation 410 further produces side surfaces 372B and 372B$^0$. In some embodiments, the side surfaces 372B spans an angle $\theta_B$ from the top surface of the top surface of the ILD layer 108. And the side surface 372B$^0$ spans an angle $\theta_D$ and the angle $\theta_D^0$ from the top surface of ILD layer 108. The angle $\theta_B$ and the angle $\theta_B^0$ may be the same as or different from each other. Furthermore, the angles $\theta_D$ and the angle $\theta_D^0$ may be the same as or different from the angles $\theta_B$ and the angle $\theta_B^0$. In the depicted embodiments, the angles $\theta_D$, $\theta_D^0$, $\theta_B$, and $\theta_B^0$ may be about 30° to about 90°. In some embodiments the angles $\theta_D$, $\theta_D^0$, $\theta_B$, and $\theta_B^0$ are greater than the angle $\theta_C$ and angle $\theta_C^0$. For example, a ratio of the angle $\theta_D$, $\theta_D^0$, $\theta_B$, and $\theta_B^0$ to the angle $\theta_C$ may be about 1.05:1 to about 1.5:1 (when measured in degrees (°)). If the angles $\theta_D$, $\theta_D^0$, $\theta_B$, and $\theta_B^0$ are too large, such as greater than about 90°, or if the ratio is too large, such as greater than about 1.5:1, subsequent deposition may not efficiently fill the contact trench without leaving voids. If the angles $\theta_D$, $\theta_D^0$, $\theta_B$, and $\theta_B^0$ are too small, such as less than about 30°, or if the ratio is too small, such as less than about 1.05:1, the etching operation 410 may not effectively expand the bottom surface of the contact trench, and may not effectively increase the surface area of the interface between the source/drain feature 110A and the subsequent formed contact. As described above, the angles are indicative of the slopes of the relevant side surfaces. Accordingly, the slope of the side surface 372D to the slope of the side surface 372A may be about 1.05:1 to about 1.5:1.

Referring to FIG. 13, another etching operation 420 is conducted to remove the remaining hard mask layer 132' from the top surface of the device 100 and from the contact trench portions 142A and 142C. The etching operation 420 may be any suitable etching methods. As a result, the expanded contact trench 142-1 is formed. Meanwhile, the contact trench 142B is not substantially altered. For the purpose of consistency, the contact trench 142B is also referred to as 142-2. Accordingly, as can be seen from FIG. 13, the contact trench 142-1 has a side surface 372A (and a side surface 372C which aligns with the side surface 372A) and an opposing side surface 372D⁰. The side surfaces 372A and 372C are collectively referred to as the side surface 372C' hereinafter for simplicity. Side surface 372C' spans an angle $\theta_C$ from the top surface of the ILD layer 108. Side surface 372D⁰ spans an angle $\theta_D^0$ from the top surface of the ILD layer 108. The side surface 372C' has a slope that is less than the slope of the side surface 372D⁰. For example, the slope of the side surface 372D⁰ to the slope of the side surface 372C' may be about 1.05:1 to about 1.5:1. The side surface 372C' is spaced away from the adjacent source/drain feature 110B by a distance 368b along the Y direction. The distance 368b may be similar to the distance 368b described above with respect to FIG. 2.

Figure 14:
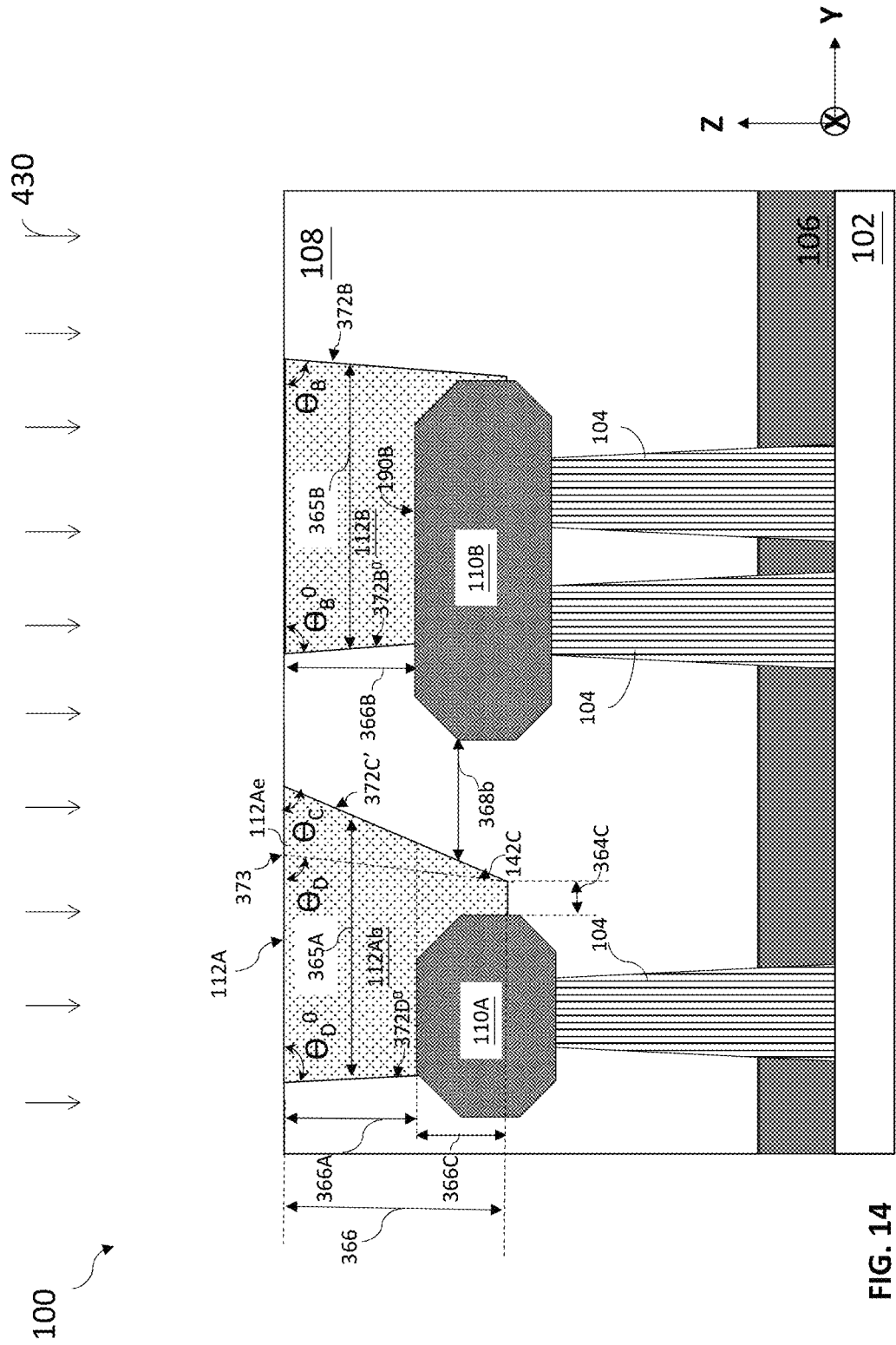

Referring to FIG. 14 and to block 208 of FIG. 18, a deposition operation 430 is implemented to deposit the metal layer in the contact trenches 142-1 and 142-2, thereby forming the contact features 112A and 112B, respectively. In some embodiments, a barrier layer is formed prior to the deposition operation 430. Accordingly, the barrier layer interposes between the contact features 112A, 112B and the respective source/drain features 110A, 110B, as well as the ILD layer 108. In some embodiments, a CMP operation is conducted to remove excess materials from the top surface of the IC device 100 so as to expose the top surface of the ILD layer 108 and to planarize the top surface. In the depicted embodiments, the contact feature 112A has a depth dimension 366 which is the sum of the depth dimension 366A and the depth dimension 366C. Because the deposition operation 430 fills the contact trench 142-1 in its entirety, the contact feature 112A is formed on the side surface 372C' adjacent to the source/drain feature 110B, and on the side surface 372D⁰ remote from the source/drain feature 110B. In some embodiments an imaginary line 373 can be drawn from a bottom corner adjacent to the source/drain feature 110B extending upwards to intersect with the top surface of the source/drain contact 112A. Accordingly the imaginary line 373 divides the contact feature 112A into two portions, the bulk portion 112Ab and an extension portion 112Ae. In some embodiments, the extension portion 112Ae fulfills the functionality similar to the extension portion 112Ae described above with respect to FIG. 5. For example, the extension portion 112Ae may include a portion approaching or overhanging over the source/drain feature 110B, without forming a short circuit. This provides increased top surface area for the contact 112A, such that subsequently formed via features thereon may simultaneously maximize contact surface areas with the contact 112A and with an overlaying metal line. As a result, the overall contact resistance may be reduced as compared to approaches not implementing the methods provided herein.

Figure 15:
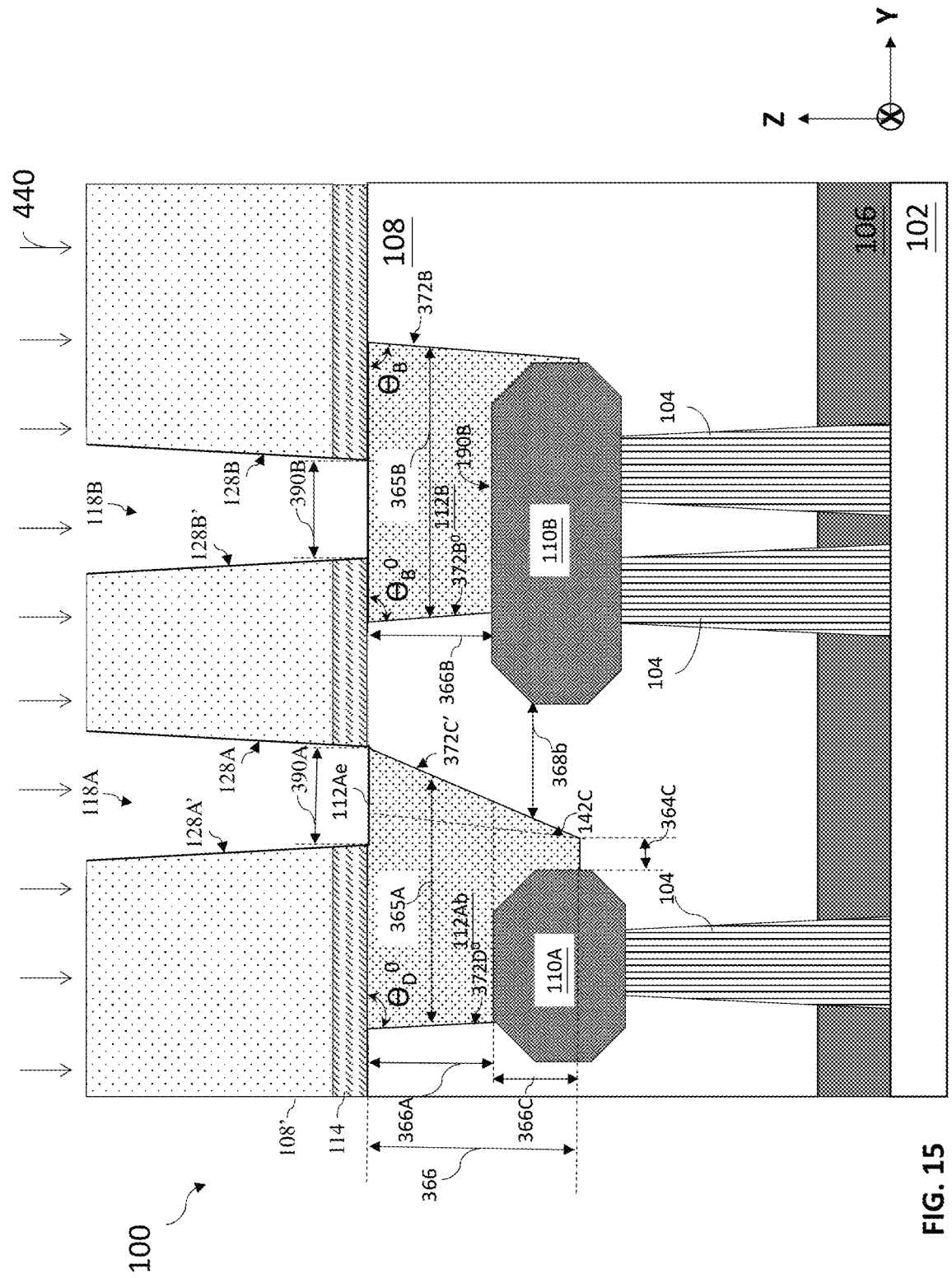

Referring to FIG. 15 and to block 210 of FIG. 18, an etching stop layer 114 and ILD layer 108' is formed over the IC device 100. Moreover, referring to FIG. 15 and to block 212 of FIG. 18, an etching operation 440 opens up portions of the ILD layer 108' and the contact etching stop layer 114 to expose a top surface of the contact feature 110A and the contact feature 110B. This process resembles the etching operation 440 described above with respect to FIG. 6. For example, the via trenches 118A, 118B each have a bottom surface having a lateral width 390A, 390B, respectively. Moreover, the via trench 118A is formed primarily over the extension portion 112Ae. For example, more than half of the top surface exposed in the via trench 118A belongs to the extension portion 112Ae, and less than half of the top surface exposed in the via trench 118A belongs to the bulk portion 112Ab.

Figure 16:
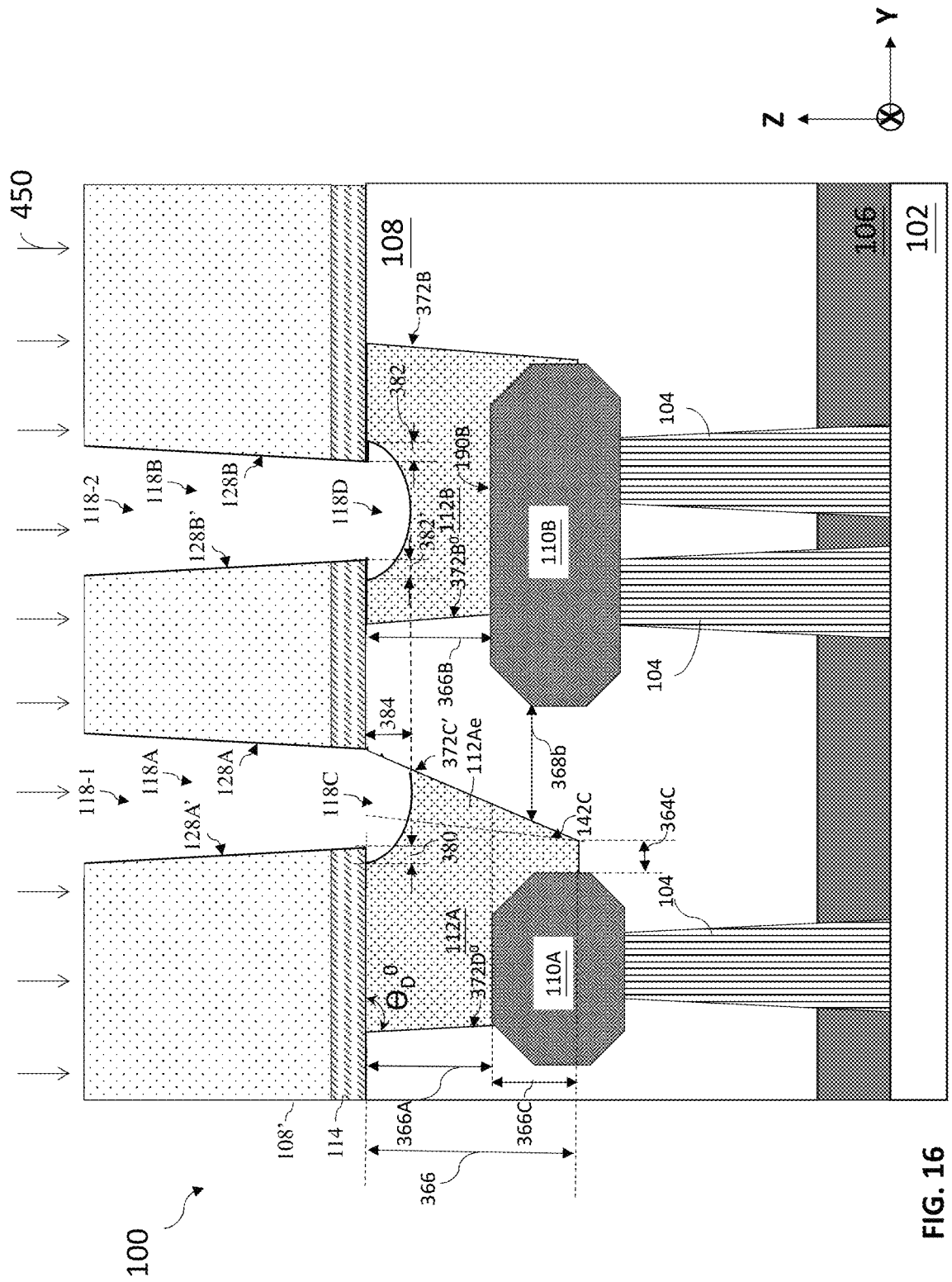
Figure 17:
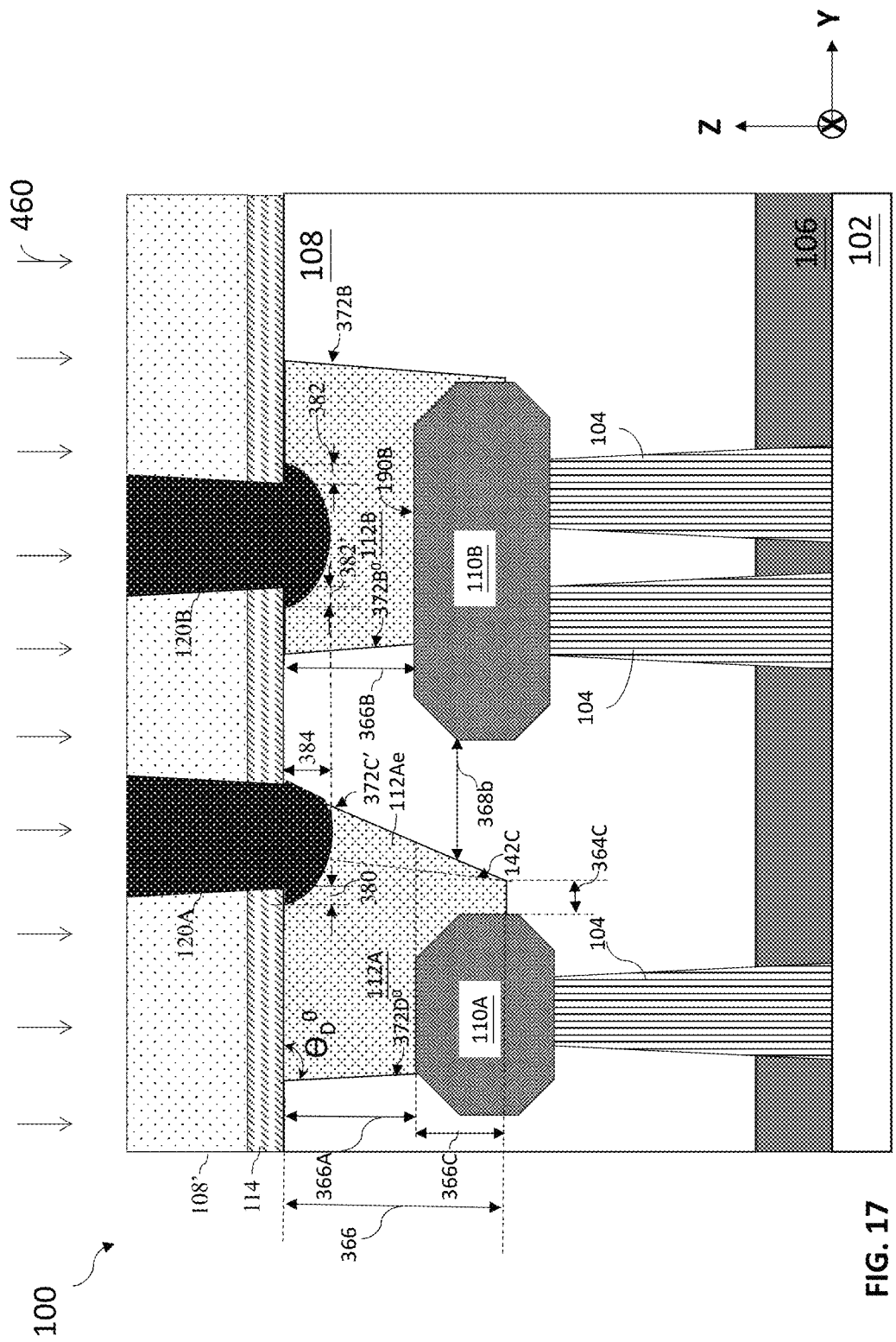

Referring to FIG. 16 and to block 214 of FIG. 18, an additional etching operation 450 is conducted to form via trench portion 118C from the top surface of the contact 112A and via trench portion 118D from the top surface of the contact 112B. The etching operation 450 may resemble the etching operation 450 described above with respect to FIG. 7. Accordingly, the via trench portions 118C and 118D each resemble the respective contact trench portions described above with respect to FIG. 7. For example, the top surface of the via trench portions 118C and 118B are wider than the respective bottom surfaces of the via trench portions 118A and 118B, respectively. For example, the via trench portion 118C includes an anchoring section that has a lateral width 380; and the via trench portion 118D includes two anchoring sections that have lateral widths 382 and 382', respectively. The dimensions and profiles of these anchoring sections may resemble those already described above with respect to FIG. 7. The via trench portions 118A and 118C collectively form via trench 118-1; and the via trench portions 118A and 118C collectively form via trench 118-2.

Referring to FIG. 17, a deposition operation 450 is conducted to fill the via trenches 118-1 and 118-2 with a metal layer. The metal layer may be similar to that described above. Subsequently, a CMP operation may be conducted to provide a planarized top surface with the ILD layer 108' exposed. As a result, the via feature 120A is formed in the via trench 118-1; and the via feature 120B is formed in the via trench 118-2. The via features 120A, 120B each resemble those corresponding via features described above with respect to FIG. 8. For example, the via feature 120A may be formed on the crescent-shaped top surface of the etched contact 112A. Moreover, the via feature 120A may be primarily located on the extension portion 112Ae (such as having over 50% of its lateral dimension along the Y-direction on the top surface of the etched extension portion 112Ae.

Additional steps may be performed to complete the fabrication of the IC device 100. Further, additional steps can be provided before, during, and after the method 200, and some of the steps described can be replaced, relocated, or eliminated for other embodiments of the method 200.

The disclosure above describes two example methods for making the IC device 100 having an increased top surface area for the contact feature 112A without causing an excessively large bottom surface for the contact feature 112A. These methods alleviates the shorting risk with adjacent source/drain features (such as the source/drain feature 112B). In the illustrated embodiments, the IC device 100 has a contact feature 112A with asymmetric sidewall profiles. For example, the slope of one side surface of the contact feature 112A is different from the slope of an opposing side surface of the same contact feature 112A. For example, one side surface of the contact feature 112A has a continuous straight side surface while the opposing side surface of the same contact feature 112 has a straight segment connected to a curved segment. Moreover, in some embodiments, while the contact 112A has the asymmetric profile, the adjacent contact 112B may have a symmetric profile. For example, the angle $\theta_B$ may be substantially similar to the angle $\theta_B'^0$. Furthermore, the top surface of the contacts 112A, 112B may each include a curved portion interfacing with an overlaying via feature. For example, the via features 120A, 120B may each include one or more anchoring features embedded under the etch-stop layer 114.

Figure 19:
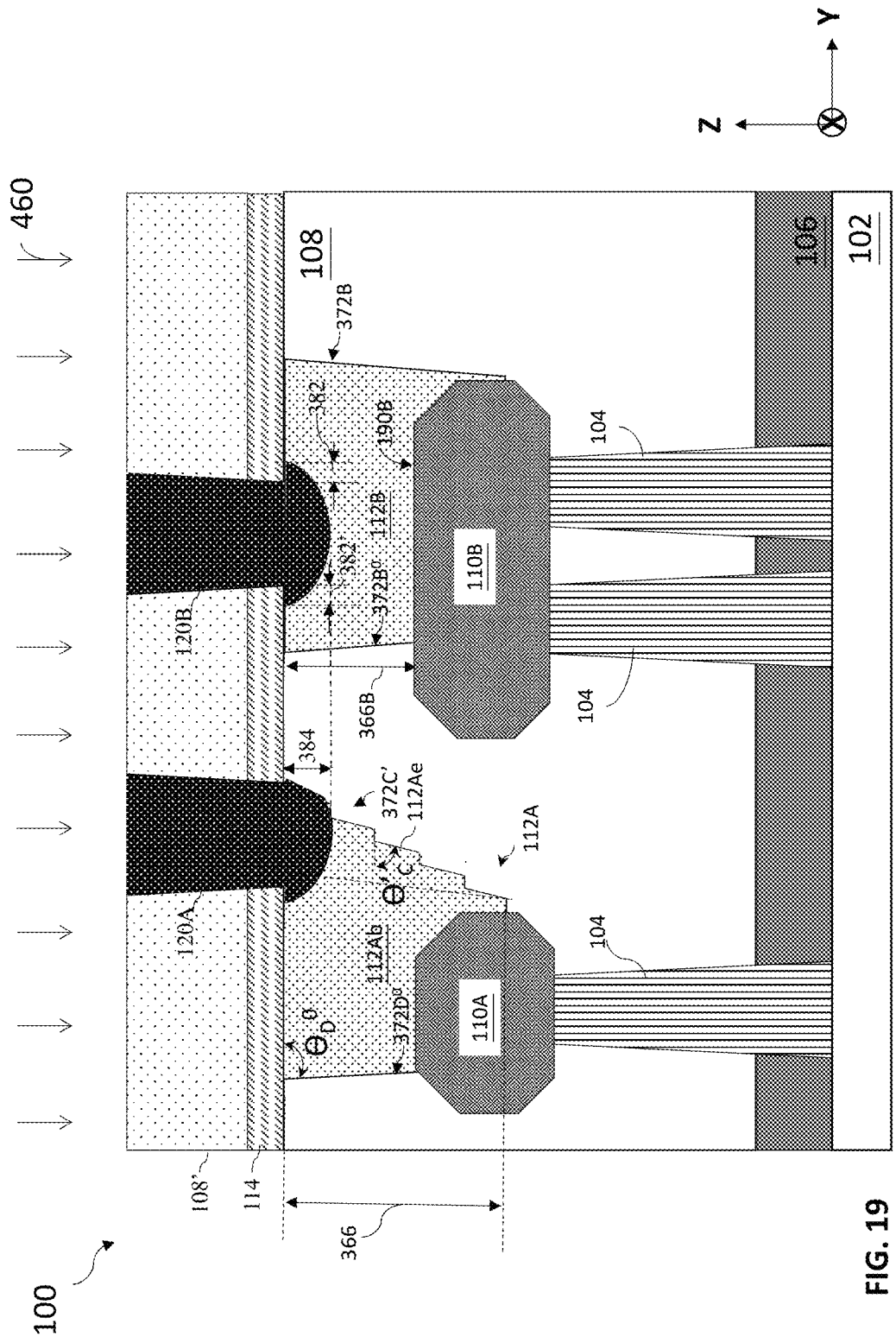
Figure 20:
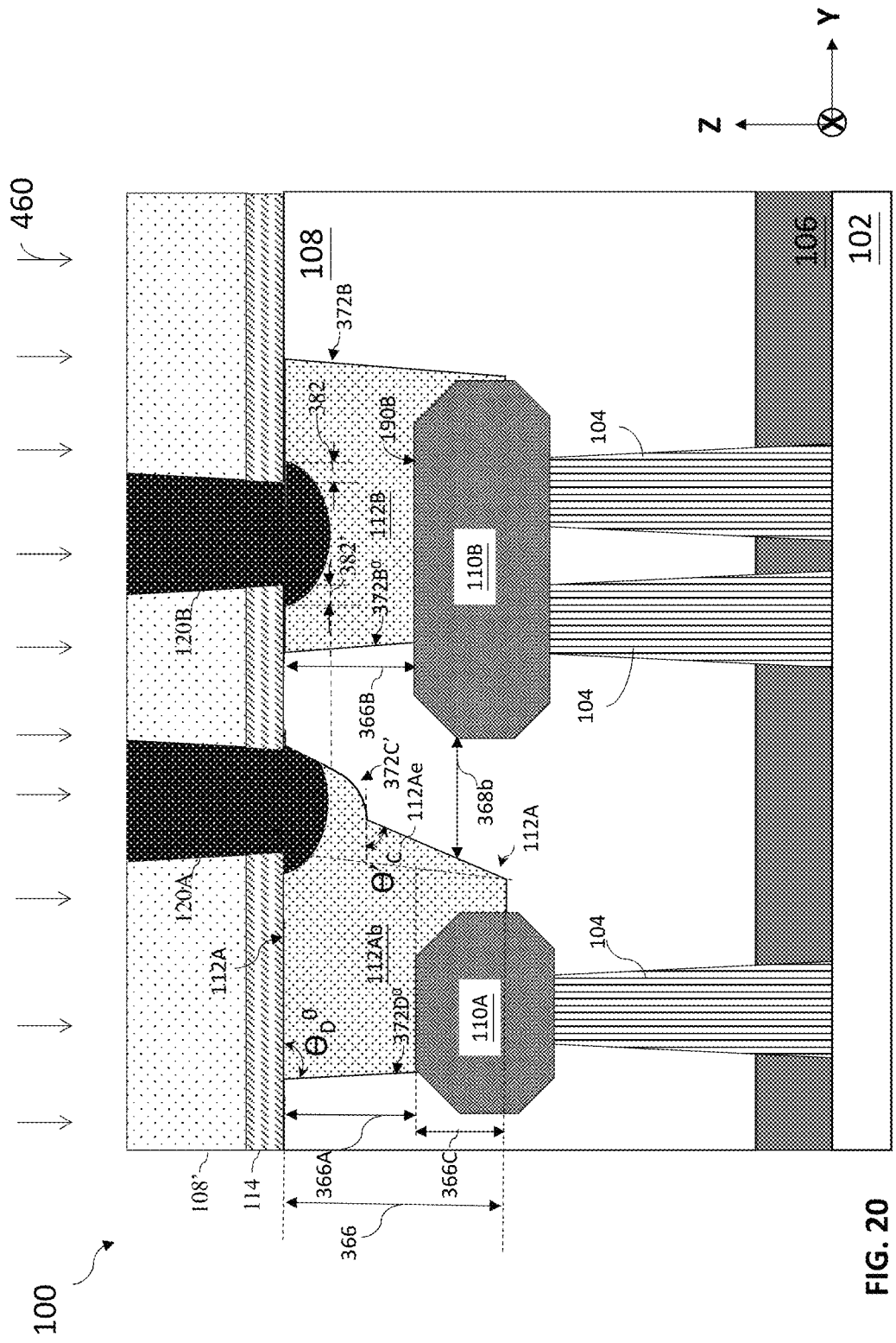
Figure 21:
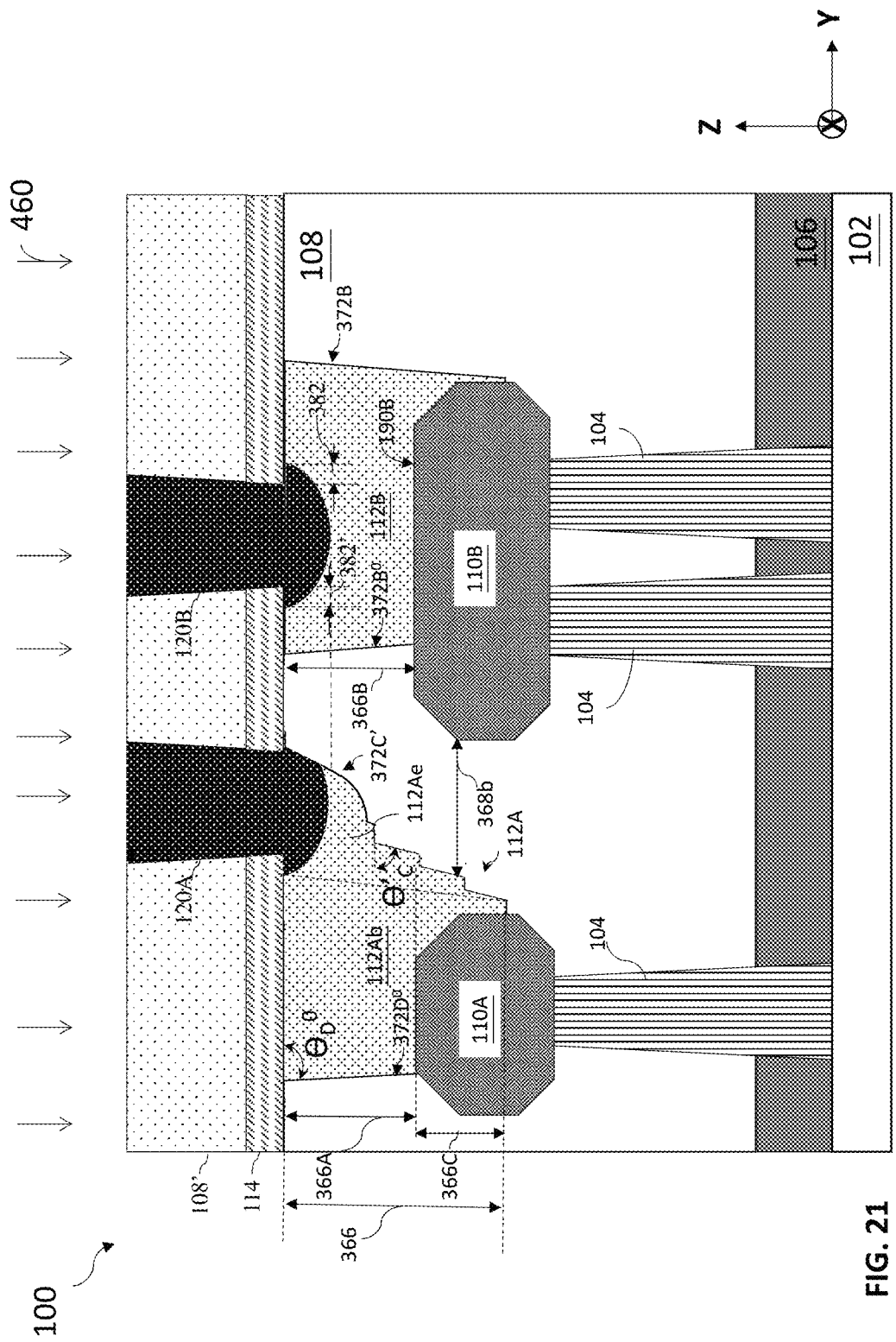

Still further, the present disclosure contemplates variations to these structures and devices described above. For example, FIGS. 19, 20, and 21 describe three further variations. Referring to FIG. 19, the side surface 372C' of the contact 112A adjacent the source/drain feature 110B may include multiple segments (or steps). Each segment may have a side surface that spans an angle $\theta'_C$ from a plane parallel to the top surface of the ILD layer 108. The angle $\theta'c$ may be similar to or different from the angle $\theta_C$ described above with respect to FIG. 10. The contact 112A further has an opposing side surface 372D⁰, which spans an angle $\theta_D^0$ from the top surface of the contact 112A. In some embodiments, the angle $\theta'_C$ may be less than the angle $\theta_D^0$. However, the present disclosure also contemplates the angle $\theta'_C$ being the same as or greater than the angle $\theta_D^0$. Referring to FIG. 20, the side surface 372C' between the source/drain features 110A and 110B may have two segments. The straight segment is similar to the side surface 372C' described above with respect to FIG. 17, and the curved segment is similar to the curved surface 372D described above with respect to FIG. 5. In other words, the embodiment of FIG. 20 includes both features described above with respect to FIGS. 8 and 17. Referring to FIG. 21, the side surface 372C' between the source/drain features 110A and 110B may include multiple segments, with the top segment resembling the side surface 372D described above with respect to FIG. 5, while the lower multiple segments each resembles the side surface 372C' of FIG. 17. In some embodiments, each segment of the side surface 372C' may be fabricated using a process similar to those described above, or using a combination of processes similar to those described above.

Though not intended to be limiting, embodiments of the present disclosure offer benefits for semiconductor processing and semiconductor devices, as compared to conventional devices. For example, the top surface of the contact feature is expanded, such that via features formed thereon may have larger interfaces with the contact feature and overlaying metal lines simultaneously; and the bottom surface of the contact feature is not excessively large, such that any risk for shorting with adjacent contact features or source/drain features are minimal. For example, via features include anchoring sections that secure the via features and ensure good electrical contact with the contact features. These improvements allow for reduced contact resistances between the contact feature and the source/drain features, and between the contact feature and the via features. Accordingly, device performances are optimized. Although the disclosure above primarily focuses on the structures and methods for forming the contact features and via features, similar structures and methods may be implemented for other conductive features, and improve contact resistances thereof without introducing excessive shorting risks.

The present disclosure provides for many different embodiments. An exemplary semiconductor device includes a substrate, a first conductive feature, a second conductive feature, and a third conductive feature over the substrate. The first conductive feature has a first top surface and a side surface. The third conductive feature is on the first top surface of the first conductive feature and is spaced away from the second conductive feature. The third conductive feature has a first sidewall and a second sidewall opposing the first sidewall. The first sidewall extends between the first conductive feature and the second conductive feature. At least a segment of the first sidewall has a first slope. The second sidewall has a second slope. The second slope is greater than the first slope.

In some embodiments, the first conductive feature is a first source/drain feature, the second conductive feature is a second source/drain feature, and the third conductive feature is a contact feature. In some embodiments, a ratio of the first slope to the second slope is about 1:1.05 to about 1:1.5. In some embodiments, the first sidewall has a lower segment below the higher segment. The lower segment has the second slope; and the higher segment has the first slope. In some embodiments, the third conductive feature includes a portion protruding out from the first sidewall towards the second conductive feature. In some embodiments, the third conductive feature includes an overhanging portion vertically over the second conductive feature along a vertical direction perpendicular to the first top surface. In some embodiments, the semiconductor device further comprises a fourth conductive feature on a top surface of the second conductive feature. The fourth conductive feature has a third sidewall and a fourth sidewall. Moreover, the third sidewall and the fourth sidewall each has the second slope. In some embodiments, the semiconductor device further includes a fifth conductive feature. The fifth conductive feature includes an anchoring feature extending outwardly from a sidewall of the fifth conductive feature. Additionally, the anchoring feature has a top surface extending along a top surface of the third conductive feature.

An exemplary semiconductor device includes a substrate, a first source/drain feature and a second source drain feature over the substrate and adjacent to each other. The semiconductor device also includes a contact feature on the first source/drain feature. The contact feature includes an extension portion over and spaced away from the second source/drain feature along a direction perpendicular to a top surface of the substrate.

In some embodiments, the contact feature has a first sidewall that has a first slope and a second sidewall that has the first slope. The extension portion extends outwardly from the first sidewall. In some embodiments, the contact feature includes a first sidewall and a second sidewall. The first sidewall has a first slope; and the second sidewall has a second slope. The first slope is less than the second slope. Moreover, the second sidewall is a sidewall of the extension portion. In some embodiments, the extension portion has a concave surface of a first crescent profile facing upwards. Moreover, the extension portion has a convex surface of a second crescent profile facing the second source/drain feature. In some embodiments, the contact feature is a first contact feature. The semiconductor device further includes a second contact feature on the second source/drain feature. The first contact feature has side surfaces of different slopes, and the second contact feature have side surfaces of a same slope. In some embodiments, the via feature includes a bottom section and a top section. The bottom section has a first surface extending along a top surface of the contact feature. The top section is above and connected to the bottom section at the first surface. Moreover, the bottom section has a first lateral dimension on the first surface, the top section has a second lateral dimension on the first surface, and the first lateral dimension is greater than the second lateral dimension.

An exemplary method includes receiving a semiconductor workpiece. The workpiece has a first conductive feature and a second conductor feature each embedded within a dielectric layer and adjacent to each other. The method also includes forming a first trench on the first conductive feature and a second trench on the second conductive feature. The first trench and the second trench has different sidewall profiles. The method further includes depositing to form a third conductive feature in the first trench and a fourth conductive feature in the second trench. The forming of the first trench and the second trench includes etching to modify a first sidewall of the first trench.

In some embodiments, the forming of the first trench and the second trench includes etching to form a first initial trench and a second initial trench. Moreover, the forming of the first trench and the second trench includes etching to form an extension feature on the first sidewall of the first initial trench. The extension feature reaches over the second conductive feature without reaching the second trench. In some embodiments, the forming of the first trench and the second trench includes etching to form a first initial trench, where the first initial trench exposes a portion of the first conductive feature. Moreover, the first initial trench has the first sidewall with a first slope and a second sidewall with a second slope. The forming of the first trench and second trench also includes forming a masking element. The masking element has openings exposing the first conductive feature and the second conductive feature. The masking element is partially formed on the first sidewall and is not formed on the second sidewall. The forming of the first trench and second trench further includes etching through the openings of the masking element to modify the second sidewall to having a third slope, and to form the second trench having a third sidewall with the third slope. The third slope is greater than the second slope. In some embodiments, the forming of the first trench includes forming the first trench with a plurality of steps on the first sidewall. Moreover, the etching to modify the first sidewall of the first trench includes conducting a plurality of etching operations, where each etching operation produces a step of the plurality of the steps. In some embodiments, the etching to modify the first sidewall of the first trench does not modify a second sidewall of the first trench.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device, comprising:
a substrate;
a first conductive feature and a second conductive feature over the substrate, the first conductive feature having a first top surface and a side surface; and
a third conductive feature on the first top surface of the first conductive feature and spaced away from the second conductive feature,
wherein the third conductive feature has a first sidewall extending between the first conductive feature and the second conductive feature, and has a second sidewall opposing the first sidewall,
wherein at least a segment of the first sidewall has a first slope, the second sidewall has a second slope, and the second slope is greater than the first slope,
wherein the first conductive feature is a first source/drain feature, the second conductive feature is a second source/drain feature, and the third conductive feature is a contact feature.

2. The semiconductor device of claim 1, wherein a ratio of the first slope to the second slope is about 1:1.05 to about 1:1.5.

3. The semiconductor device of claim 1, wherein the first sidewall has a lower segment below a higher segment, wherein the lower segment has the second slope, and wherein the higher segment has the first slope.

4. The semiconductor device of claim 1, wherein the third conductive feature includes a portion protruding out from the first sidewall towards the second conductive feature.

5. The semiconductor device of claim 1, wherein the third conductive feature includes an overhanging portion vertically over the second conductive feature along a vertical direction perpendicular to the first top surface.

6. The semiconductor device of claim 1, further comprising a fourth conductive feature on a top surface of the second conductive feature, the fourth conductive feature having a third sidewall and a fourth sidewall, wherein the third sidewall and the fourth sidewall each has the second slope.

7. The semiconductor device of claim 1, further comprising a fifth conductive feature on the third conductive feature,
wherein the fifth conductive feature includes an anchoring feature extending outwardly from a sidewall of the fifth conductive feature, the anchoring feature having a top surface extending along a top surface of the third conductive feature.

8. A semiconductor device, comprising:
a substrate;
a first source/drain feature and a second source/drain feature over the substrate and adjacent to each other; and
a contact feature on the first source/drain feature,
wherein the contact feature includes an extension portion over and spaced away from the second source/drain feature along a direction perpendicular to a top surface of the substrate.

9. The semiconductor device of claim 8, wherein the contact feature has a first sidewall having a first slope and a second sidewall having the first slope, and wherein the extension portion extends outwardly from the first sidewall.

10. The semiconductor device of claim 8, wherein the contact feature includes a first sidewall having a first slope and a second sidewall having a second slope,
wherein the first slope is less than the second slope, and
wherein the second sidewall is a sidewall of the extension portion.

11. The semiconductor device of claim 8, wherein the extension portion has a concave surface of a first crescent profile facing upwards and a convex surface of a second crescent profile facing the second source/drain feature.

12. The semiconductor device of claim 8, wherein the contact feature is a first contact feature, the semiconductor device further comprising a second contact feature on the second source/drain feature, wherein the first contact feature has side surfaces of different slopes, and the second contact feature have side surfaces of a same slope.

13. The semiconductor device of claim 8, further comprising a via feature on the contact feature,
wherein the via feature includes a bottom section having a first surface extending along a top surface of the contact feature and a top section above and connected to the bottom section at the first surface, and
wherein the bottom section has a first lateral dimension on the first surface, the top section has a second lateral dimension on the first surface, and the first lateral dimension is greater than the second lateral dimension.

14. A semiconductor device, comprising:
a first source/drain feature over a substrate;
a second source/drain feature over the substrate and adjacent to the first source/drain feature;
a first contact feature landing on the first source/drain feature;
a second contact feature landing on the second source/drain feature; and
a first via feature landing on a top surface of the first contact feature,
wherein the first contact feature has an extending portion that extends past a side surface of the first source/drain feature, and the extending portion is disposed between the first source/drain feature and the second source/drain feature,
wherein the first via feature lands on the extending portion.

15. The semiconductor device of claim 14,
wherein the first contact feature has a first sidewall surface and a second sidewall surface opposing the first sidewall surface,
wherein the first sidewall surface has a constant slope, and the second sidewall surface has segments with different slopes.

16. The semiconductor device of claim 15, wherein one of the segments has a curved surface.

17. The semiconductor device of claim 15, wherein one of the segments has a horizontal surface.

18. The semiconductor device of claim 15, wherein one of the segments has a different slope from another one of the segments.

19. The semiconductor device of claim 15,
wherein the second contact feature has a third sidewall surface and a fourth sidewall surface opposing the third sidewall surface,
wherein the third sidewall surface has a constant slope, and the fourth sidewall surface has a constant slope.

20. The semiconductor device of claim 14,
wherein the first contact feature has a first sidewall surface and a second sidewall surface opposing the first sidewall surface,
wherein the first sidewall surface and the second sidewall surface both have constant slopes,
wherein the first sidewall surface has a first slope, the second sidewall surface has a second slope, and the first slope is different from the second slope.

* * * * *